(12) United States Patent
Motoshima et al.

(10) Patent No.: US 11,383,345 B2
(45) Date of Patent: Jul. 12, 2022

(54) CLEANING APPARATUS FOR HEAT EXCHANGER AND POLISHING APPARATUS

(71) Applicant: EBARA CORPORATION, Tokyo (JP)

(72) Inventors: Yasuyuki Motoshima, Tokyo (JP); Toru Maruyama, Tokyo (JP); Keisuke Kamiki, Tokyo (JP); Shuji Uozumi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 350 days.

(21) Appl. No.: 16/824,281

(22) Filed: Mar. 19, 2020

(65) Prior Publication Data

US 2020/0306920 A1 Oct. 1, 2020

(30) Foreign Application Priority Data

Mar. 29, 2019 (JP) .............................. JP2019-067930

(51) Int. Cl.
  *B24B 5/00* (2006.01)
  *B24B 37/20* (2012.01)
  *F28G 3/02* (2006.01)

(52) U.S. Cl.
  CPC ................ *B24B 37/20* (2013.01); *F28G 3/02* (2013.01)

(58) Field of Classification Search
  CPC .................................. B24B 37/20; E28G 3/02
  USPC ......................................... 451/285, 7, 41, 53
  See application file for complete search history.

(56) References Cited

U.S. PATENT DOCUMENTS

| 10,589,398 | B2 * | 3/2020 | Eto ......................... B24B 55/02 |
| 2012/0220196 | A1 * | 8/2012 | Maruyama .............. B24B 37/04 451/7 |
| 2015/0231760 | A1 * | 8/2015 | Maruyama .............. B24B 49/14 451/7 |

FOREIGN PATENT DOCUMENTS

| JP | 4030247 B2 | 1/2008 |
| JP | 5628067 B2 | 11/2014 |
| JP | 2017-148933 A | 8/2017 |

* cited by examiner

*Primary Examiner* — Joseph J Hail
*Assistant Examiner* — Shantese L McDonald
(74) *Attorney, Agent, or Firm* — BakerHostetler

(57) ABSTRACT

A cleaning apparatus capable of effectively removing dirt attached to a bottom surface of a heat exchanger, is disclosed. The cleaning apparatus cleans the heat exchanger for regulating a surface temperature of a polishing pad. This cleaning apparatus includes: a moving mechanism configured to move the heat exchanger between a temperature-regulating position in which the heat exchanger can exchange heat with the polishing pad, and a retreat position in which the heat exchanger is separated from a surface of the polishing pad; and a cleaning mechanism configured to clean a bottom surface of the heat exchanger moved to the retreat position The retreat position is located on a side of the polishing pad. The cleaning mechanism includes at least one cleaning nozzle for ejecting a cleaning liquid to the bottom surface of the heat exchanger, or a cleaning tank in which the bottom surface of the heat exchanger can be immersed.

19 Claims, 25 Drawing Sheets

CLEANING APPARATUS FOR HEAT EXCHANGER AND POLISHING APPARATUS

CROSS REFERENCE TO RELATED APPLICATION

This document claims priority to Japanese Patent Application Number 2019-067930 filed Mar. 29, 2019, the entire contents of which are hereby incorporated by reference.

BACKGROUND

A CMP (Chemical Mechanical Polishing) apparatus is used in a process of polishing a surface of a wafer in the manufacturing of a semiconductor device. The CMP apparatus is configured to hold and rotate the wafer with a polishing head, and press the wafer against a polishing pad on a rotating polishing table to polish the surface of the wafer. During polishing, a polishing liquid (or slurry) is supplied onto the polishing pad, so that the surface of the wafer is planarized by the chemical action of the polishing liquid and the mechanical action of abrasive grains contained in the polishing liquid.

A polishing rate of the wafer depends not only on a polishing load on the wafer pressed against the polishing pad, but also on a surface temperature of the polishing pad. This is because the chemical action of the polishing liquid on the wafer depends on the temperature. Therefore, in the manufacturing of a semiconductor device, it is important to maintain an optimum surface temperature of the polishing pad during polishing of the wafer in order to increase the polishing rate of the wafer, and to keep the increased polishing rate constant.

From this viewpoint, a pad-temperature regulating apparatus is conventionally used to regulate a surface temperature of a polishing pad (see Japanese laid-open patent publication No. 2017-148933, for example). The pad-temperature regulating apparatus includes a heat exchanger which contacts a surface of the polishing pad and into which a heating liquid having a regulated temperature and a cooling liquid having a regulated temperature are supplied. Changes in a flow rate of the heating liquid and a flow rate of the cooling liquid cause a temperature of the heat exchanger to be changed. The heat exchanger exchange heat with the polishing pad, and as a result, the surface temperature of the polishing pad changes. Therefore, the flow rates of the heating liquid and the cooling liquid supplied into the heat exchanger can be regulated to thereby maintain the surface temperature of the polishing pad, during polishing of the wafer, at a desired optimum temperature. After completing polishing of the wafer, the heat exchanger is separated from the surface of the polishing pad.

During polishing of the wafer, the heat exchanger is placed in contact with the surface of the polishing pad, and thus dirt, such as abrasive grains contained in the polishing liquid, and wear particles of the polishing pad, adheres to the surface of the heat exchanger. When dirt falls down from the heat exchanger during polishing of the wafer, and is caught between the polishing pad and the wafer, scratches are formed on the surface of the wafer. The scratches can be a cause of defects that lower a reliability of the semiconductor devices. In other words, Scratches can cause a decrease in the yield of semiconductor devices. Therefore, a conventional polishing apparatus has one or more cleaning liquid nozzles that eject a cleaning liquid, such as pure water, toward the heat exchanger (for example, see Japanese Patent No. 5628067). The cleaning liquid nozzles spray the cleaning liquid onto the heat exchanger separated from the surface of the polishing pad to thereby wash away dirt attached to the surface of the heat exchanger.

However, the heating liquid is continuously supplied to the heat exchanger in order to quickly reach the surface temperature of the polishing pad to the desired temperature. Namely, even when the heat exchanger is separated from the polishing pad, the heat exchanger is in a heated state. Therefore, in some cases, the liquid component in the polishing liquid attached to the heat exchanger evaporates, and thus dirt (particularly, solid components such as abrasive grains contained in the polishing liquid) may firmly adhere to the surface of the heat exchanger.

Further, in recent years, there has been a demand for shortening a cleaning time of the heat exchanger to improve a throughput of the polishing apparatus, and therefore, it has become difficult to set aside enough ejecting time of the cleaning liquid for removing dirt attached to the heat exchanger. Further, a downsizing of the polishing apparatus is also required, and thus, in some cases, the cleaning liquid ejected from the cleaning liquid nozzles cannot be effectively applied to the bottom surface of the heat exchanger where the most dirt adheres (i.e., the surface that is in contact with or close to the surface of the polishing pad).

SUMMARY OF THE INVENTION

Therefore, there is provided a cleaning apparatus capable of effectively removing dirt attached to a bottom surface of a heat exchanger. Further, there is provided a polishing apparatus including such a cleaning apparatus.

Embodiments, which will be described below, relate to a cleaning apparatus for a heat exchanger to regulate a surface temperature of a polishing pad for polishing a substrate such as a wafer. Further, the embodiments, which will be described below, relates to a polishing apparatus including such a cleaning apparatus.

In an embodiment, there is provided a cleaning apparatus for a heat exchanger to regulate a surface temperature of a polishing pad, comprising: a moving mechanism configured to move the heat exchanger between a temperature-regulating position in which the heat exchanger can exchange heat with the polishing pad, and a retreat position in which the heat exchanger is separated from a surface of the polishing pad; and a cleaning mechanism configured to clean a bottom surface of the heat exchanger moved to the retreat position, wherein the retreat position is located on a side of the polishing pad, and the cleaning mechanism includes at least one cleaning nozzle for ejecting a cleaning liquid to the bottom surface of the heat exchanger moved to the retreat position, or a cleaning tank in which the bottom surface of the heat exchanger can be immersed.

In an embodiment, there is provided a cleaning apparatus for a heat exchange to regulate a surface temperature of a polishing pad, comprising: a moving mechanism configured to move the heat exchanger between a temperature-regulating position in which the heat exchanger can exchange heat with the polishing pad, and a retreat position in which the heat exchanger is separated from a surface of the polishing pad; and a cleaning mechanism configured to clean a bottom surface of the heat exchanger moved to the retreat position, wherein the retreat position is located above the polishing pad, and the cleaning mechanism includes a cleaning tank in which the bottom surface of the heat exchanger can be immersed.

In an embodiment, the cleaning mechanism further includes: a cleaning-liquid supply line coupled to the cleaning tank; and a cleaning-liquid discharge line coupled to the cleaning tank, and the cleaning-liquid discharge line is coupled to the lowermost end of the cleaning tank.

In an embodiment, the cleaning mechanism further includes: a cleaning-liquid supply line coupled to the cleaning tank; an overflow tank for receiving the cleaning liquid overflowing from the cleaning tank; and a cleaning-liquid discharge line coupled to the overflow tank.

In an embodiment, the cleaning mechanism further includes: a cleaning-liquid supply line coupled to the cleaning tank; and a cleaning-liquid discharge line coupled to the cleaning tank, the cleaning-liquid discharge line has an inlet opened inside of the cleaning tank, and the inlet is located below an upper end of the cleaning tank.

In an embodiment, the cleaning mechanism further includes: a cleaning-liquid supply line coupled to the cleaning tank; and a cleaning-liquid discharge line coupled to the cleaning tank, the cleaning-liquid discharge line has an inlet coupled to the lowermost end of the cleaning tank, and an outlet opened to the atmosphere, and the outlet is located at a position lower than an upper end of the cleaning tank and higher than a lower end of the cleaning tank.

In an embodiment, the cleaning-liquid supply line is mounted to a side wall of the cleaning tank such that the cleaning liquid is discharged in a tangential direction of the cleaning tank.

In an embodiment, the cleaning mechanism includes a plate member which constitutes a bottom wall of the cleaning tank or is disposed inside of the cleaning tank, and the plate member has a flow passage coupled to the cleaning-liquid supply line, and a plurality of holes which enables the flow passage to communicate with an inside of the cleaning tank.

In an embodiment, the moving mechanism includes: a pivoting mechanism configured to pivot the heat exchanger with respect to the surface of the polishing pad in a horizontal direction; and an elevating mechanism configured to move the heat exchanger upward and downward with respect to the surface of the polishing pad.

In an embodiment, the moving mechanism includes: a pivoting mechanism configured to turn the heat exchanger with respect to the surface of the polishing pad in a vertical direction while pivoting the heat exchanger with respect to the surface of the polishing pad in a horizontal direction; and an elevating mechanism configured to move the heat exchanger upward and downward with respect to the surface of the polishing pad.

In an embodiment, the pivoting mechanism includes; a shaft coupled to the heat exchanger through an arm; an actuator configured to rotate the shaft to pivot the arm and the heat exchanger with respect to the surface of the polishing pad; a cam mechanism configured to convert a rotational movement of the shaft into a turning movement of the heat exchanger, and the cam mechanism includes: a cam fixed to the arm; and a guide plate having a guide surface for guiding the turning movement of the heat exchanger.

In an embodiment, the moving mechanism includes: a piston-cylinder mechanism having a piston; and a link mechanism configured to convert movement of the piston into a vertically pivoting movement of the arm to which the heat exchanger is coupled.

In an embodiment, the cleaning mechanism includes a cleaning member which contacts the bottom surface of the heat exchanger during moving of the heat exchanger from the temperature-regulating position to the retreat position.

In an embodiment, the cleaning member is a cleaning brush, and the cleaning brush is disposed in a cutout formed in an upper end of a cylindrical cup which surrounds the polishing pad.

In an embodiment, the cleaning member is a cleaning brush, and the cleaning mechanism further includes a cleaning plate which contacts a surface of the cleaning brush to remove dirt attached to the cleaning brush.

In an embodiment, the cleaning mechanism is a cleaning brush mechanism configured to contact the bottom surface of the heat exchanger lying in the retreat position, and the cleaning brush mechanism includes: a cleaning brush which contacts the bottom surface of the heat exchanger; a brush stand in which the cleaning brush is disposed; a cleaning block having an opening configured to eject the cleaning liquid to the bottom surface of the heat exchanger; and a rotational shaft to which the brush stand and the cleaning block are coupled, and which are rotated by utilizing a reaction force generated when the cleaning liquid is ejected from the cleaning block.

In an embodiment, the cleaning member is a cleaning pad having a brush which contact the bottom surface of the heat exchanger, and the cleaning pad is configured to be rotatable around its axis and revolvable with respect to the bottom surface of the heat exchanger.

In an embodiment, the cleaning pad includes: an imaging device which is disposed in a recess formed in an upper surface of the cleaning pad, and can acquire an image of the bottom surface of the heat exchanger; and a transparent window for closing an opening of the recess.

In an embodiment, there is provided a polishing apparatus comprising: a polishing table for supporting a polishing pad; a polishing head configured to press a substrate against a surface of the polishing pad to polish the substrate; a heat exchanger configured to regulate a surface temperature of the polishing pad; and a cleaning apparatus for cleaning the heat exchanger, wherein the cleaning apparatus comprises the above-described cleaning apparatus.

According to the above-described embodiments, the cleaning liquid is ejected from the cleaning liquid nozzle to the bottom of the heat exchanger moved to the retreat position, or the bottom of the heat exchanger moved to the retreat position is immersed in the cleaning tank in which the cleaning liquid is stored. As a result, dirt is prevented from firmly adhering to the bottom surface of the heat exchanger, and dirt can be effectively removed from the bottom surface of the heat exchanger.

DESCRIPTION OF EMBODIMENTS

Embodiments will now be described with reference to the drawings.

Figure 1:
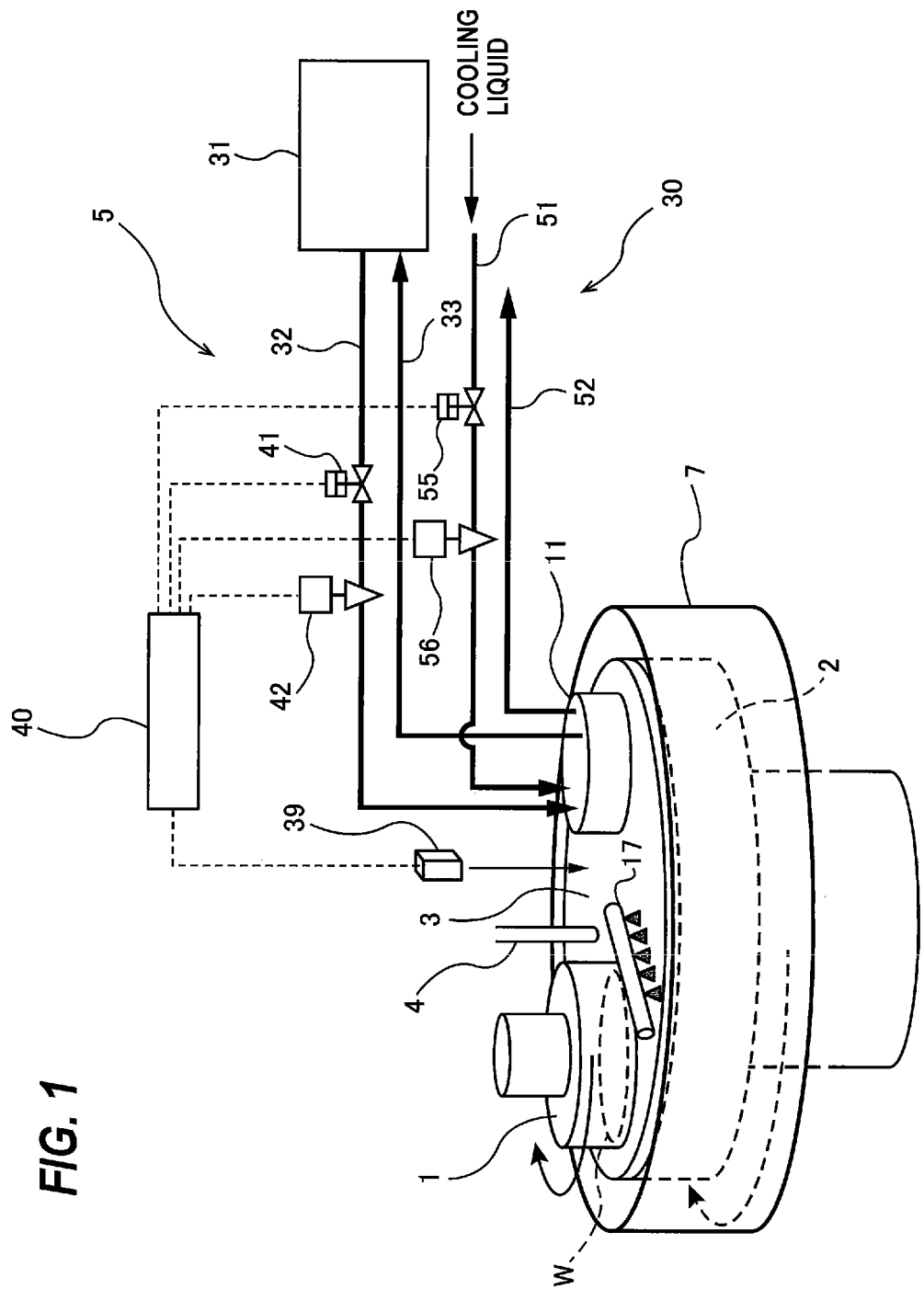
FIG. 1 is a schematic view showing a polishing apparatus according to an embodiment.
Figure 2:
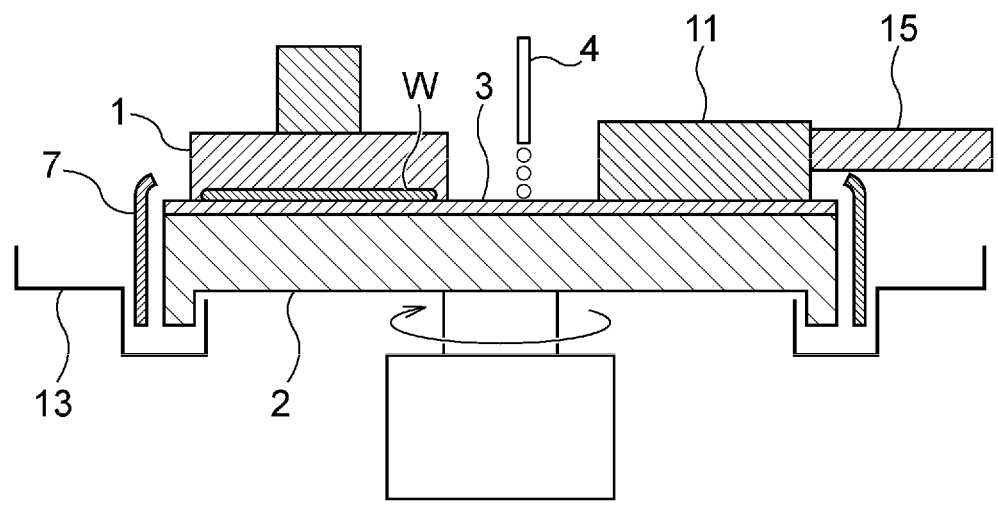
FIG. 2 is schematic cross-sectional view of a main part of the polishing apparatus shown in FIG. 1.

FIG. 1 is a schematic view showing a polishing apparatus according to an embodiment. FIG. 2 is schematic cross-sectional view of a main part of the polishing apparatus shown in FIG. 1. The polishing apparatus shown in FIGS. 1 and 2 includes a polishing head 1 for holding and rotating a wafer W which is an example of a substrate, a polishing table 2 that supports a polishing pad 3, a polishing-liquid supply nozzle 4 for supplying a polishing liquid (e.g. a slurry) onto a surface of the polishing pad 3, and a pad-temperature regulating apparatus 5 for regulating a surface temperature of the polishing pad 3. The surface (upper surface) 3a of the polishing pad 3 provides a polishing surface for polishing the wafer W.

The polishing head 1 is vertically movable, and is rotatable about its axis in a direction indicated by arrow. The wafer W is held on a lower surface of the polishing head 1 by, for example, vacuum suction. A motor (not shown) is coupled to the polishing table 2, so that the polishing table 2 can rotate in a direction indicated by arrow. As shown in FIG. 1, the polishing head 1 and the polishing table 2 rotate in the same direction. The polishing pad 3 is attached to the upper surface of the polishing table 2.

Polishing of the wafer W is performed in the following manner. The wafer W, to be polished, is held by the polishing head 1, and is then rotated by the polishing head 1. The polishing pad 3 is rotated together with the polishing table 2. In this state, the polishing liquid is supplied from the polishing-liquid supply nozzle 4 onto the surface of the polishing pad 3, and the surface of the wafer W is then pressed by the polishing head 1 against the surface 3a, i.e. the polishing surface, of the polishing pad 3. The surface of the wafer W is polished by the sliding contact with the polishing pad 3 in the presence of the polishing liquid. The surface of the wafer W is planarized by the chemical action of the polishing liquid and the mechanical action of abrasive grains contained in the polishing liquid.

As shown in FIG. 1, the polishing apparatus may include an atomizer 17 for spraying a liquid, such as pure water, onto the polishing pad 3 to thereby remove foreign matters on the polishing pad 3. After finishing polishing of the wafer W, pure water is sprayed from the atomizer 17 onto the rotating polishing pad 3, removing the foreign maters, such as polishing debris, from the polishing pad 3. Further, the polishing apparatus may include a cylindrical cup 7 for preventing the polishing apparatus from being contaminated by a polishing liquid splattered from the rotating polishing table 2 during polishing of the wafer W, and a collection pan 13 (see FIG. 2) disposed below the cylindrical cup 7. The polishing liquid splattered from the polishing table 2 collides with an inner circumferential surface of the cylindrical cup 7, and flows downwardly along the inner circumferential surface of the cylindrical cup 7, and then is collected in the collection pan 13. The collection pan 13 is coupled to a drain (not shown), so that the polishing liquid that has been collected in the collection pan 13 is discharged through the drain from the polishing apparatus.

The pad-temperature regulating apparatus 5 includes a heat exchanger 11 which can contact the surface of the polishing pad 3, and a liquid supply system 30 for supplying a heating liquid having a regulated temperature and a cooling liquid having a regulated temperature into the heat exchanger 11. This liquid supply system 30 includes a heating-liquid supply tank 31 as a heating-liquid supply source for storing the heating liquid having a regulated temperature, and a heating-liquid supply pipe 32 and a heating-liquid return pipe 33, each coupling the heating-liquid supply tank 31 to the heat exchanger 11. One ends of the heating-liquid supply pipe 32 and the heating-liquid return pipe 33 are coupled to the heating-liquid supply tank 31, while the other ends are coupled to the heat exchanger 11.

The heating liquid having a regulated temperature is supplied from the heating-liquid supply tank 31 to the heat exchanger 11 through the heating-liquid supply pipe 32, flows in the heat exchanger 11, and is retuned from the heat exchanger 11 to the heating-liquid supply tank 31 through the heating-liquid return pipe 33. In this manner, the heating liquid circulates between the heating-liquid supply tank 31 and the heat exchanger 11. The heating-liquid supply tank 31 has a heater (not shown), so that the heating liquid is heated by the heater to have a predetermined temperature.

A first on-off valve 41 and a first flow control valve 42 are attached to the heating-liquid supply pipe 32. The first flow control valve 42 is located between the heat exchanger 11 and the first on-off valve 41. The first on-off valve 41 is a valve not having a flow rate regulating function, whereas the first flow control valve 42 is a valve having a flow rate regulating function.

The liquid supply system 30 further includes a cooling-liquid supply pipe 51 and a cooling-liquid discharge pipe 52, both coupled to the heat exchanger 11. The cooling-liquid supply pipe 51 is coupled to a cooling-liquid supply source (e.g. a cold water supply source) provided in a factory in which the polishing apparatus is installed. The cooling liquid is supplied to the heat exchanger 11 through the cooling-liquid supply pipe 51, flows in the heat exchanger 11, and is drained from the heat exchanger 11 through the cooling-liquid discharge pipe 52. In one embodiment, the cooling liquid that has flowed through the heat exchanger 11 may be returned to the cooling-liquid supply source through the cooling-liquid discharge pipe 52.

A second on-off valve 55 and a second flow control valve 56 are attached to the cooling-liquid supply pipe 51. The second flow control valve 56 is located between the heat exchanger 11 and the second on-off valve 55. The second on-off valve 55 is a valve not having a flow rate regulating function, whereas the second flow control valve 56 is a valve having a flow rate regulating function.

The pad-temperature regulating apparatus 5 further includes a pad-temperature measuring device 39 for measuring a surface temperature of the polishing pad 3 (which may hereinafter be referred to as pad surface temperature), and a valve controller 40 for operating the first flow control valve 42 and the second flow control valve 56 based on the pad surface temperature measured by the pad-temperature measuring device 39. The first on-off valve 41 and the second on-off valve 55 are usually open. A radiation thermometer, which can measure the surface temperature of the polishing pad 3 in a non-contact manner, can be used as the pad-temperature measuring device 39.

The pad-temperature measuring device 39 measures the surface temperature of the polishing pad 3 in a non-contact manner, and sends the measured value of the surface temperature to the valve controller 40. Based on the pad surface temperature measured, the valve controller 40 operates the first flow control valve 42 and the second flow control valve 56 to control the flow rates of the heating liquid and the cooling liquid so that the pad surface temperature is maintained at a preset target temperature. The first flow control valve 42 and the second flow control valve 56 operate according to control signals from the valve controller 40 and regulate the flow rates of the heating liquid and the cooling liquid to be supplied to the heat exchanger 11. Heat exchange occurs between the polishing pad 3 and the heating liquid and cooling liquid, flowing in the heat exchanger 11, whereby the pad surface temperature changes.

Such feedback control can maintain the surface temperature of the polishing pad 3 (i.e., the pad surface temperature) at a predetermined target temperature. A PID controller may be used as the valve controller 40. The target temperature of the polishing pad 3 is determined depending on the type of the wafer W or on the polishing process, and the determined target temperature is inputted into the valve controller 40 in advance.

In order to maintain the pad surface temperature at the predetermined target temperature, the heat exchanger 11 is moved to a temperature-regulating position, where the heat exchanger 11 can exchange heat with the polishing pad 3, during polishing of the wafer W. In this embodiment, the heat exchanger 11 lying in the temperature-regulating position is placed in contact with the surface (i.e. the polishing surface) of the polishing pad 3. In this specification, the manner of contact of the heat exchanger 11 with the surface of the polishing pad 3 includes not only direct contact of the heat exchanger 11 with the surface of the polishing pad 3, but also contact of the heat exchanger 11 with the surface of the polishing pad 3 in the presence of a polishing liquid (or slurry) between the heat exchanger 11 and the surface of the polishing pad 3. The temperature-regulating position of the heat exchanger 11 may be a position in which the heat exchanger 11 is separated from the polishing pad 3 as long as the heat exchanger can exchange heat with the polishing pad 3. In any case, heat exchange occurs between the polishing pad 3 and the heating liquid and cooling liquid, flowing in the heat exchanger 11, whereby the pad surface temperature is controlled.

Hot water may be used as the heating liquid to be supplied to the heat exchanger 11. When it is intended to raise the surface temperature of the polishing pad 3 more quickly, a silicone oil may be used as the heating liquid. Cold water or a silicone oil may be used as the cooling liquid to be supplied to the heat exchanger 11. In the case of using a silicone oil as the cooling liquid, the polishing pad 3 can be cooled quickly by coupling a chiller as a cooling-liquid supply source to the cooling-liquid supply pipe 51, and by cooling the silicone oil to a temperature of not more than 0° C. Pure water can be used as the cold water. In order to cool pure water to produce cold water, a chiller may be used as a cooling-liquid supply source. In this case, cold water that has flowed through the heat exchanger 11 may be returned to the chiller through the cooling-liquid discharge pipe 52.

The heating-liquid supply pipe 32 and the cooling-liquid supply pipe 51 are completely independent pipes. Thus, the heating liquid and the cooling liquid can be simultaneously supplied to the heat exchanger 11 without mixing with each other. The heating-liquid return pipe 33 and the cooling-liquid discharge pipe 52 are also completely independent pipes. Thus, the heating liquid is returned to the heating-liquid supply tank 31 without mixing with the cooling liquid, while the cooling liquid is either drained or returned to the cooling-liquid supply source without mixing with the heating liquid.

When the wafer W is polished in the polishing apparatus, dirt, such as abrasive grains contained in the polishing liquid, and polishing debris, adheres to the heat exchanger 11 in contact with the polishing pad 3. Therefore, the pad-temperature regulating apparatus 5 has a cleaning apparatus for cleaning dirt attached to the heat exchanger 11. The cleaning apparatus includes a moving mechanism and a cleaning mechanism, which will be described later. The moving mechanism causes the heat exchanger 11 to move from the temperature-regulating position, where the heat exchanger 11 can exchange heat with the polishing pad 3 (i.e., where the heat exchanger 11 directly contacts or is close to the surface of the polishing pad 3), to a retreat position where the heat exchanger 11 is separated from the surface of the polishing pad 3. The cleaning mechanism serves as a mechanism for cleaning at least the bottom surface of the heat exchanger 11 moved to the retreat position.

Figure 3:
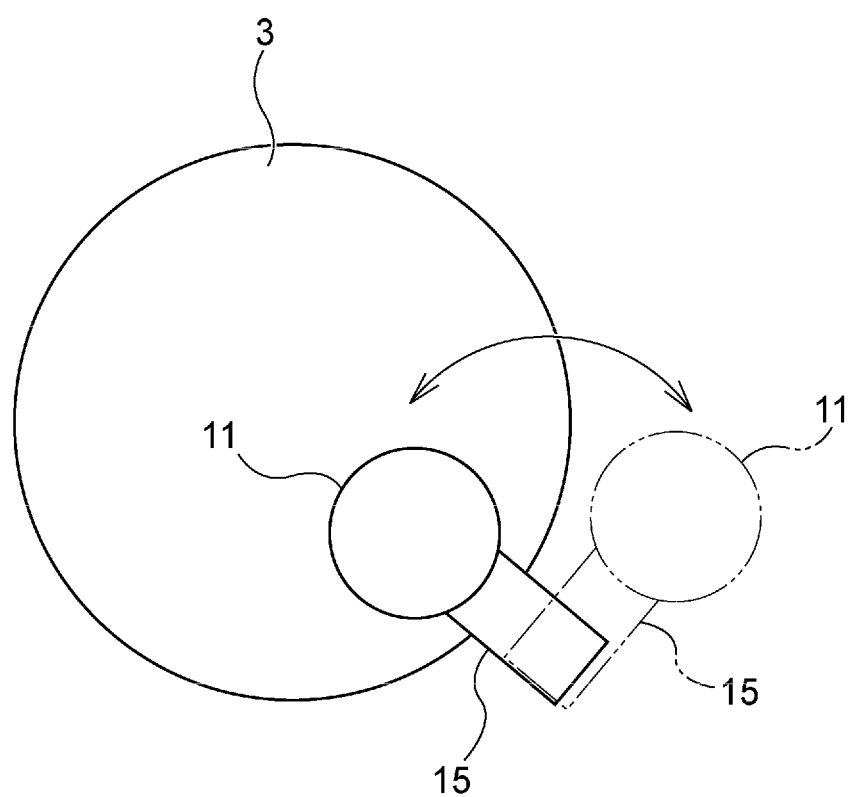
FIG. 3 is a plan view schematically showing an example of a state in which a heat exchanger moves to a retreat position.
Figure 4:
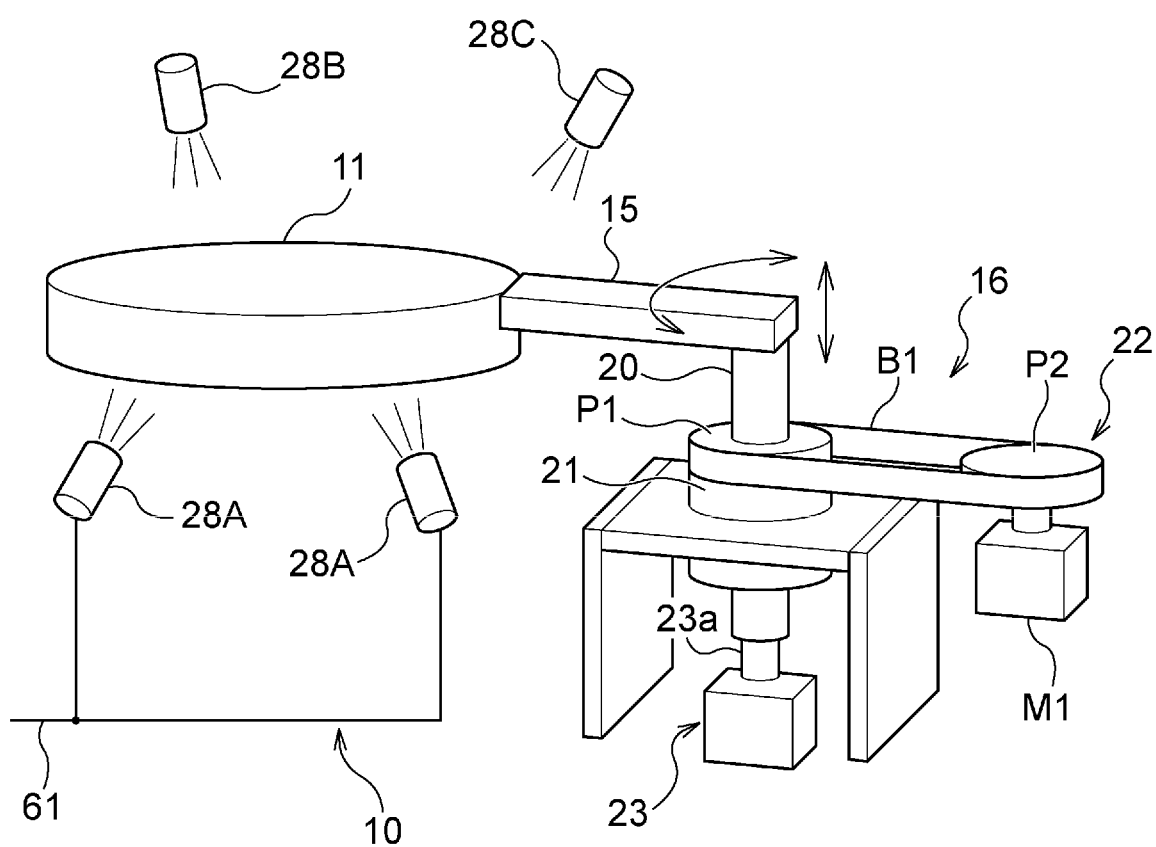
FIG. 4 is a perspective view schematically showing the heat exchanger coupled to a moving mechanism according to an embodiment.
Figure 5:
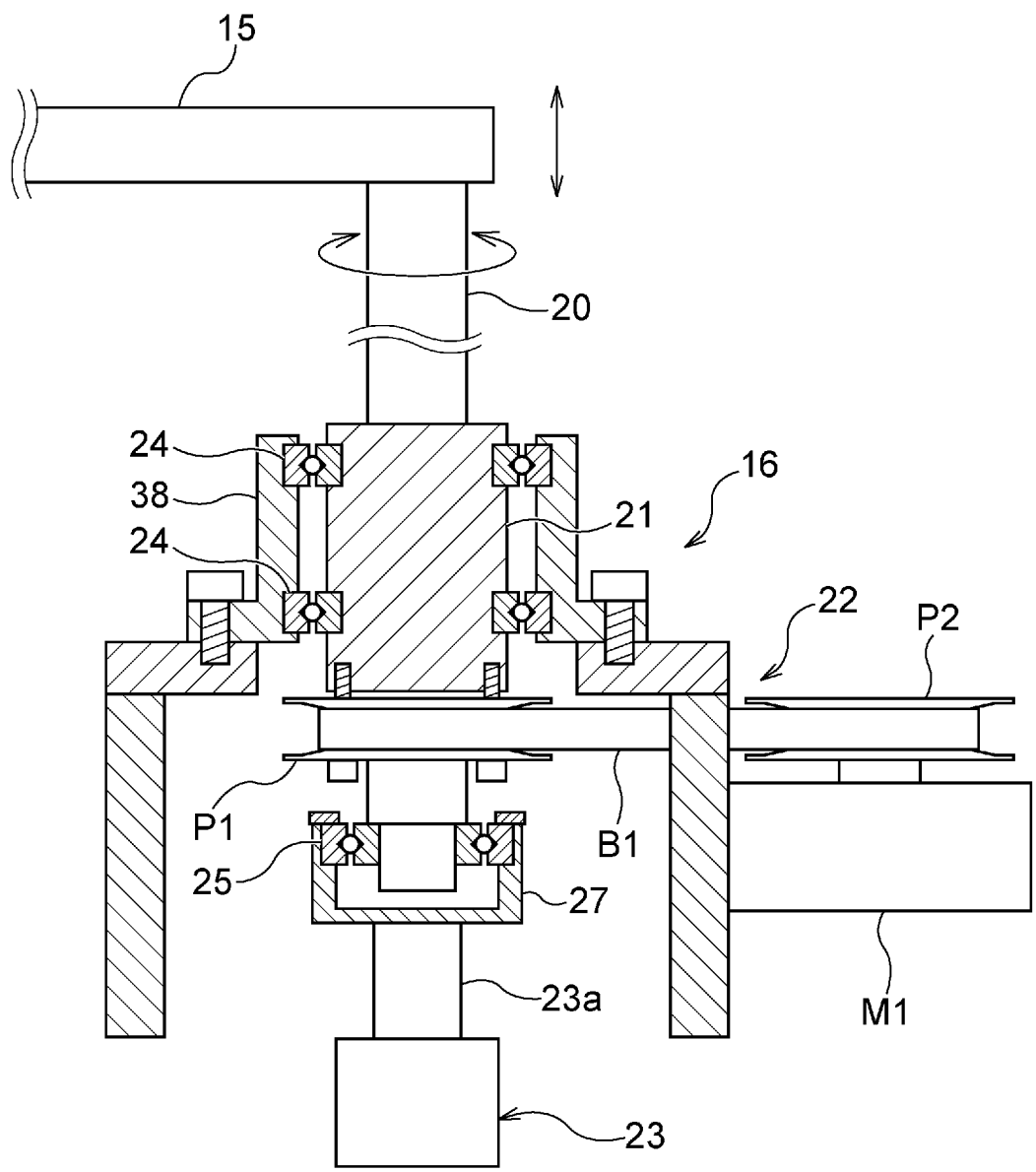
FIG. 5 is a schematic cross-sectional view of the moving mechanism shown in FIG. 4.

FIG. 3 is a plan view schematically showing an example of a state in which the heat exchanger 11 moves to the retreat position. FIG. 4 is a perspective view schematically showing the heat exchanger 11 coupled to the moving mechanism according to an embodiment, and FIG. 5 is a schematic cross-sectional view of the moving mechanism shown in FIG. 4. In the example shown in FIG. 3, the retreat position is located on the side of the polishing pad 3 (see the two-dot chain line in FIG. 3). When the polishing of the wafer W is completed, the heat exchanger 11 is moved to the retreat position, shown in FIGS. 4 and 5, by the moving mechanism 16.

As shown in FIG. 4, the heat exchanger 11 is coupled to one end of an arm 15. The moving mechanism 16 shown in FIG. 4 causes the arm 15 and the heat exchanger 11 to be moved upward with respect to the polishing pad 3 from a temperature-regulating position where the heat exchanger 11 contacts the surface of the polishing pad 3 and to be further rotated, thereby moving the heat exchanger to the retreat position. The moving mechanism 16 includes a shaft 20 fixed to the arm 15, an elevating mechanism 23 for vertically moving the shaft 20, a pivoting mechanism 22 for rotating the shaft 20, and a ball spline bearing 21 for supporting the shaft 20 so as to be vertically movable. The shaft 20 shown in FIG. 4 is a spline shaft fixed to an end opposite to the end of the arm 15 to which the heat exchanger 11 is fixed.

In this embodiment, the elevating mechanism 23 is configured as a piston-cylinder mechanism. As shown in FIG. 5, a tip of the piston 23a of the elevating mechanism 23 is fixed to a lower end of a joint member 27. The joint member 27 has a recess formed therein, and a bearing 25 for rotatably supporting the lower end of the shaft 20 is disposed on the wall surface of the recess. To the elevating mechanism 23, a fluid (for example, compressed air, and nitrogen gas) used for moving the piston 23a up and down is supplied from a fluid supply source (not shown). When the fluid is supplied to the elevating mechanism 23, the piston 23a is raised whereby the shaft 20 is raised through the joint member 27 and the bearing 25. Since the shaft 20 is coupled to the arm 15, and the arm 15 is coupled to the heat exchanger 11, raising of the shaft 20 causes the arm 15 and the heat exchanger 11 to be raised with respect to the polishing pad 3. When the supply of the fluid to the elevating mechanism 23 is stopped, the piston 23a and the shaft 20 are lowered, whereby the arm and the heat exchanger 11 are lowered.

A main body of the ball spline bearing 21 is supported through a bearing 24 to a frame 38 fixed to the polishing apparatus. The pivoting mechanism 22 includes a motor M1, a first pulley P1 fixed to the shaft 20, a second pulley P2 fixed to a rotational shaft of the motor M1, and a belt B1 riding on these pulleys p1 and p2. When the motor M1 is set in motion, the second pulley P2 is rotated, the rotation of the second pulley P2 is transmitted to the first pulley P1 through the belt B1, and the first pulley P1 is rotated. A side surface of the first pulley P1 is coupled to the main body of the ball spline bearing 21, so that, when the first pulley P1 is rotated, the ball spline bearing 21 and the shaft 20 are rotated, whereby the arm 15 and the heat exchanger 11 are pivoted with respect to the polishing pad 3. The rotational shaft of the motor M1 is rotated clockwise or counterclockwise, thereby enabling the heat exchanger 11 to be pivoted about the shaft 20 so as to be approached to or separated from the polishing pad 3.

When moving the heat exchanger 11 from the temperature-regulating position to the retreat position, the elevating mechanism 23 of the moving mechanism 16 is firstly set in motion to move the heat exchanger 11 above the polishing pad 3. Next, the pivoting mechanism 22 is set in motion to pivot the heat exchanger 11 to the retreat position beside the polishing pad 3.

As shown in FIG. 4, the cleaning apparatus includes a cleaning mechanism 10 which has at least one cleaning liquid nozzle 28A for ejecting a cleaning liquid onto the bottom surface (i.e., a contact surface with the polishing pad 3) of the heat exchanger 11 moved to the retreat position, and a cleaning-liquid supply line 61 for supplying the cleaning liquid to a cleaning liquid nozzle 28A. In the example shown in FIG. 4, two cleaning liquid nozzles 28A are disposed below the heat exchanger 11 lying in the retreat position, and the entire bottom surface of the heat exchanger 11 is cleaned by the cleaning liquid ejected from each cleaning liquid nozzle 28A.

Further, the cleaning mechanism 10 may have at least one cleaning liquid nozzle 28B for ejecting the cleaning liquid onto an upper surface and/or a side surface of the heat exchanger 11, and may have at least one cleaning liquid nozzle 28C for ejecting the cleaning liquid onto the arm 15. Although not shown in the drawings, the cleaning-liquid supply line 61 is also coupled to these cleaning liquid nozzles 28B and 28C. Provision of the cleaning liquid nozzles 28B and 28C in addition to the cleaning liquid nozzle 28A enables the cleaning mechanism 10 to spray the cleaning liquid for cleaning off dirt onto the entire heat exchanger 11 and the arm 15.

Pure water can be used as the cleaning liquid, for example. In one embodiment, the cleaning liquid may be isopropyl alcohol (IPA), or a mixture of pure water and isopropyl alcohol. The cleaning liquid may contain a surfactant. Further, the cleaning liquid nozzles 28A, 28B, 28C may be two-fluid jet nozzles configured to inject jet flow formed by the cleaning liquid and gas (for, example, compressed air, or nitrogen gas). In this case, each cleaning liquid nozzle is also coupled to a gas supply line (not shown) for supplying gas.

Figure 6:
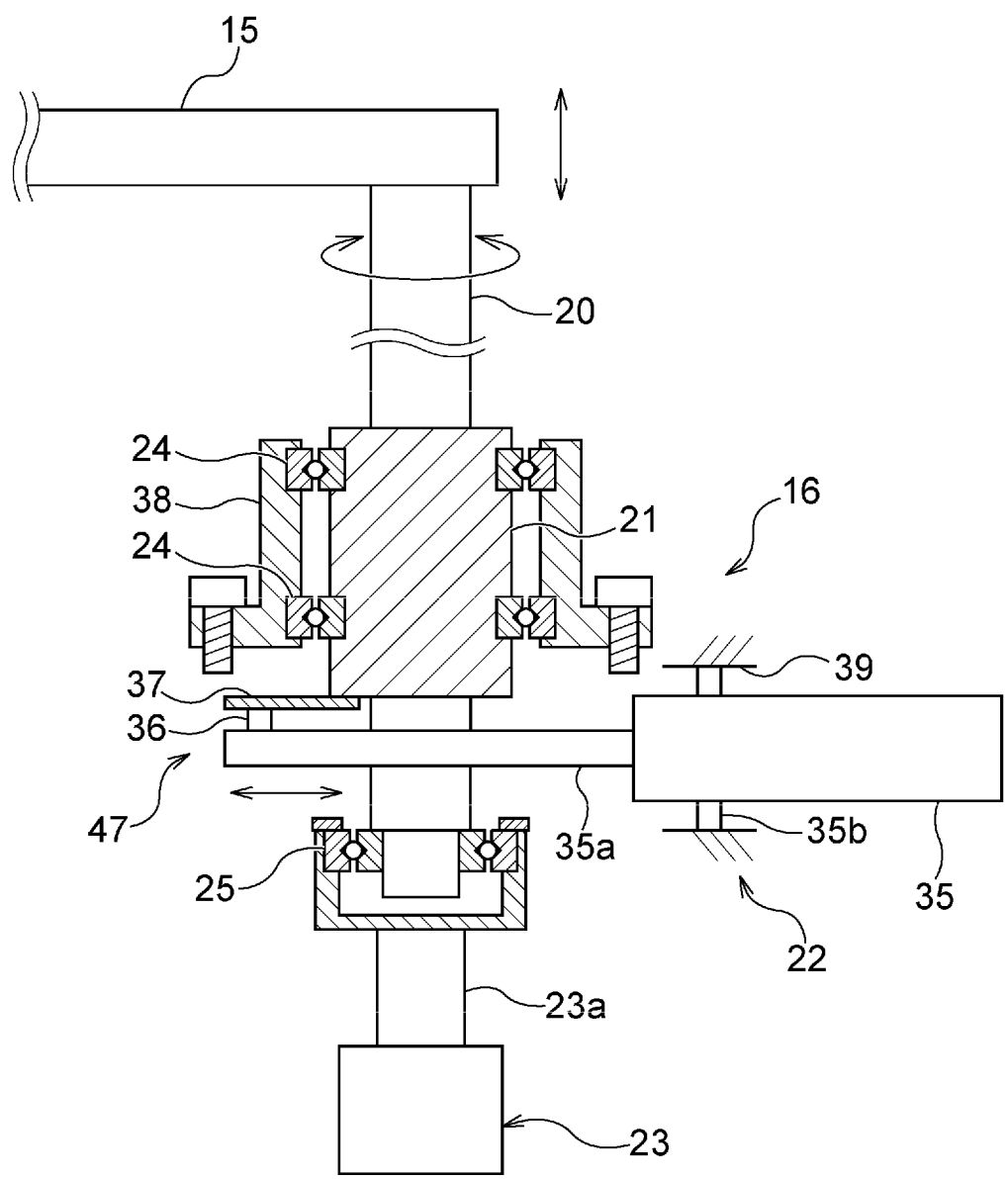
FIG. 6 is a schematic cross-sectional view of the moving mechanism according to another embodiment.

FIG. 6 is a schematic cross-sectional view of the moving mechanism 16 according to another embodiment. Structures of this embodiment, which will not be specifically described, are the same as those of the embodiment shown in FIGS. 4 and 5, and duplicate explanations will be omitted.

The pivoting mechanism 22 shown in FIG. 6 includes a piston-cylinder mechanism 35 having a piston 35*a*, and a link mechanism 47 for converting movement of the piston 35*a* into rotational movement of the shaft 20. In this embodiment, the link mechanism 47 includes a rotational shaft 36 which is rotatably attached to the piston 35*a* of the piston-cylinder mechanism 35, and a crank 37 which couples the rotational shaft 36 to the main body of the ball spline bearing 21. One end of the crank 37 is fixed to the lower end of the main body of the ball spline bearing 21, and the other end of the crank 37 is fixed to the tip (upper end) of the rotational shaft 36. The end (lower end) of the rotational shaft 36 is rotatably attached to the tip of the piston 23*a*. The piston-cylinder mechanism 35 has a rotational shaft 35*b* extending vertically from the cylinder of the piston-cylinder mechanism 35, and both ends of the rotational shaft 35*b* are rotatably attached to a stationary member 39, such as a frame of a polishing apparatus. The cylinder of the piston-cylinder mechanism 35 is coupled to a fluid supply line (not shown). When a fluid (for example, compressed air or nitrogen gas) is supplied to the cylinder of the piston-cylinder mechanism 35, the piston 35*a* moves in a direction in which the piston is pushed out from the cylinder of the piston-cylinder mechanism 35. When the supply of the fluid to the cylinder of the piston-cylinder mechanism 35 is stopped, the piston 35*a* moves in a direction in which the piston is accommodated in the cylinder of the piston-cylinder mechanism 35.

When moving the heat exchanger 11 to the retreat position, the fluid is supplied to the piston-cylinder mechanism 35 to push the piston 35*a* out from the cylinder and thus rotate the crank 37 around the rotation shaft 36. Therefore, the ball spline bearing 21 fixed to the crank 37 is rotated together with the shaft 20. When the supply of fluid to the piston-cylinder mechanism 35 is stopped, the piston 35*a* moves in the direction in which the piston is accommodated in the cylinder, and thus the crank 37 rotates in the opposite direction, and thereby the ball spline bearing 21 is rotated in the opposite direction together with the shaft 20. The cylinder of the piston-cylinder mechanism 35 can rotate around the rotational shaft 35*b* in accordance with the advancing and retreating of the piston 35*a* with respect to the cylinder. With such a configuration also, the arm 15 and the heat exchanger 11 can be pivoted around the shaft 20.

Although, in the embodiment shown in FIG. 4, the cleaning mechanism 10 includes at least one cleaning liquid nozzle 28A, this embodiment is not limited to this example. The cleaning mechanism 10 may include a cleaning tank in which the bottom surface of the heat exchanger 11 is immersed, instead of the cleaning liquid nozzle 28A. In this case, after the heat exchanger 11 is moved above the polishing pad by the elevating mechanism 23 and further moved to the side of the polishing pad 3 by the pivoting mechanism 22, the heat exchanger 11 is downward moved by the elevating mechanism 23 until the bottom surface of the heat exchanger 11 is immersed in the cleaning liquid stored in the cleaning tank. In the embodiment in which the cleaning mechanism 10 has the cleaning tank, the retreat position of the heat exchanger 11 is a position where the bottom surface of the heat exchanger 11 is immersed in the cleaning liquid in the cleaning tank.

Figure 7A:
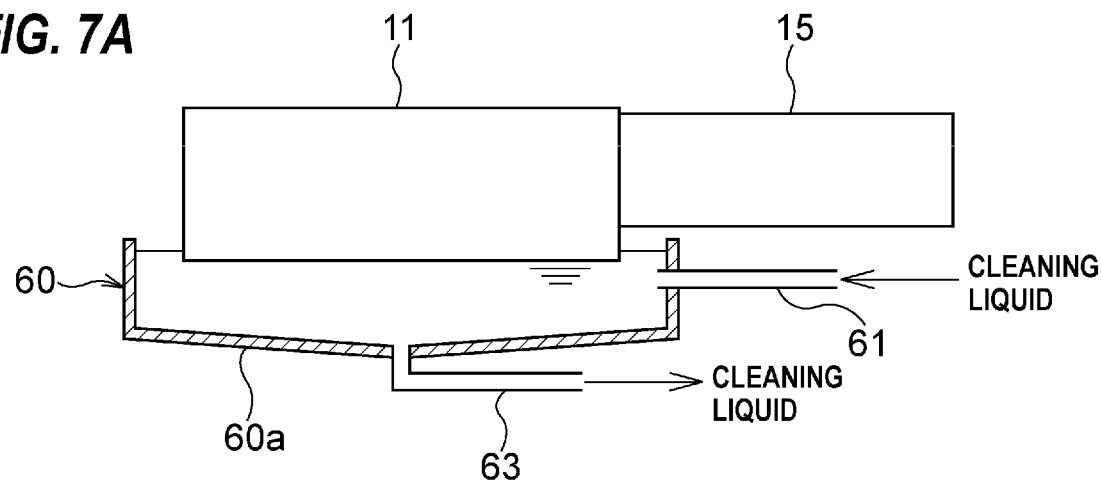
FIG. 7A is a cross-sectional view schematically showing a cleaning mechanism, which includes a cleaning tank, according to an embodiment.
Figure 7B:
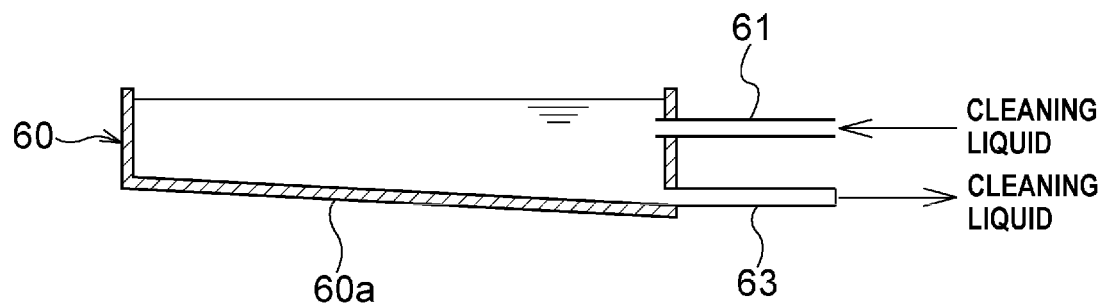
FIG. 7B is a cross-sectional view schematically showing the cleaning mechanism, which includes the cleaning tank, according to another embodiment.
Figure 7C:
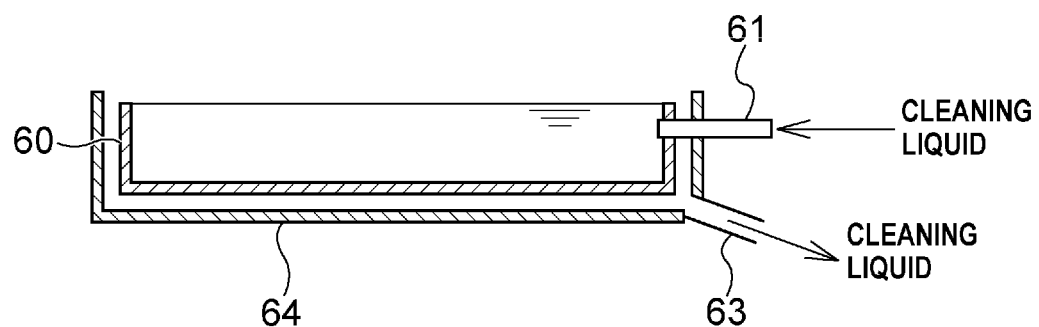
FIG. 7C is a cross-sectional view schematically showing the cleaning mechanism, which includes the cleaning tank, according to still another embodiment.

FIG. 7A is a cross-sectional view schematically showing the cleaning mechanism, which includes the cleaning tank, according to one embodiment, FIG. 7B is a cross-sectional view schematically showing the cleaning mechanism, which includes the cleaning tank, according to another embodiment, and FIG. 7C is a cross-sectional view schematically showing the cleaning mechanism, which includes the cleaning tank, according to still another embodiment.

The cleaning mechanism 10 shown in FIG. 7A includes a cleaning tank 60 which stores the cleaning liquid, a cleaning-liquid supply line 61 for suppling the cleaning liquid to the cleaning tank 60, and a cleaning-liquid discharge line 63 for draining the cleaning liquid from the cleaning tank 60. The cleaning tank 60 has a bottomed cylindrical shape whose upper part is open. The cleaning-liquid supply line 61 is coupled to a cleaning liquid supply source (not shown), and the cleaning-liquid supply line 61 penetrates a side wall of the cleaning tank 60 so that its outlet opens in the cleaning tank 60. The cleaning liquid is supplied into the cleaning tank 60 through the cleaning-liquid supply line 61. The bottom surface of the heat exchanger 11 which has been lowered from above the cleaning tank 60 by the elevating mechanism 23 is immersed in the cleaning liquid stored in the cleaning tank 60. An opening provided on the bottom wall of the cleaning tank 60 is coupled to an inlet of the cleaning-liquid discharge line 63, and the cleaning liquid in the cleaning tank 60 is drained from the polishing apparatus through the cleaning-liquid discharge line 63. A flow regulator (not shown), such as a mass flow controller or a needle valve, is preferably arranged in the cleaning-liquid supply line 61 and/or the cleaning-liquid discharge line 63 to keep a level of the cleaning liquid in the cleaning tank 60 constant.

The bottom wall 60*a* of the cleaning tank 60 shown in FIG. 7A has a funnel shape in which the bottom wall 60*a* is gradually inclined downward from the outer peripheral portion toward the center of the cleaning tank 60. An opening to which the inlet of the cleaning-liquid discharge line 63 is coupled is formed at the lowermost end of the cleaning tank 60, i.e., at the center of the bottom wall 60*a* of the cleaning tank 60. With such a configuration, dirt removed from the bottom surface of the heat exchanger 11 can be effectively discharged from the cleaning-liquid discharge line 63.

The cleaning mechanism 10 shown in FIG. 7B also includes the cleaning tank 60, the cleaning-liquid supply line 61, and the cleaning-liquid discharge line 63. However, the cleaning tank 60 shown in FIG. 7B is different from the cleaning tank 60 shown in FIG. 7A in that the bottom wall 60*a* is configured as an inclined wall that is gradually inclined downward from one outer peripheral edge toward the other outer peripheral edge. In this embodiment also, the inlet of the cleaning-liquid discharge line 63 is coupled to an opening formed at the lowermost end of the cleaning tank 60 in order to effectively discharge dirt, removed from the bottom surface of the heat exchanger 11, from the cleaning-liquid discharge line 63. In the example shown in FIG. 7B, the opening to which the inlet of the cleaning-liquid discharge line 60 is coupled is formed on the side wall adjacent to the lowermost end of the bottom wall 60a of the cleaning tank 60.

The cleaning mechanism 10 shown in FIG. 7C includes an overflow tank 64 surrounding the side wall and the bottom wall of the cleaning tank 60, in addition to the cleaning tank 60, the cleaning-liquid supply line 61, and the cleaning-liquid discharge line 63. The overflow tank 64 serves as a tank for receiving the cleaning liquid overflowing from the cleaning tank 60. In this embodiment, the cleaning-liquid discharge line 63 is coupled to the overflow tank 64 instead of the cleaning tank 60. The cleaning-liquid supply line 61 penetrates a side wall of the overflow tank 64 and the side wall of the cleaning tank 60 to open in the cleaning tank 60. The cleaning liquid in the cleaning tank 60, supplied through the cleaning-liquid supply line 61, overflows from the cleaning tank 60 beyond the side wall of the cleaning tank 60 and then flows into the overflow tank 64. The cleaning liquid overflowing into the overflow tank 64 is drained through the cleaning-liquid discharge line 63 from the polishing apparatus.

Figure 8:
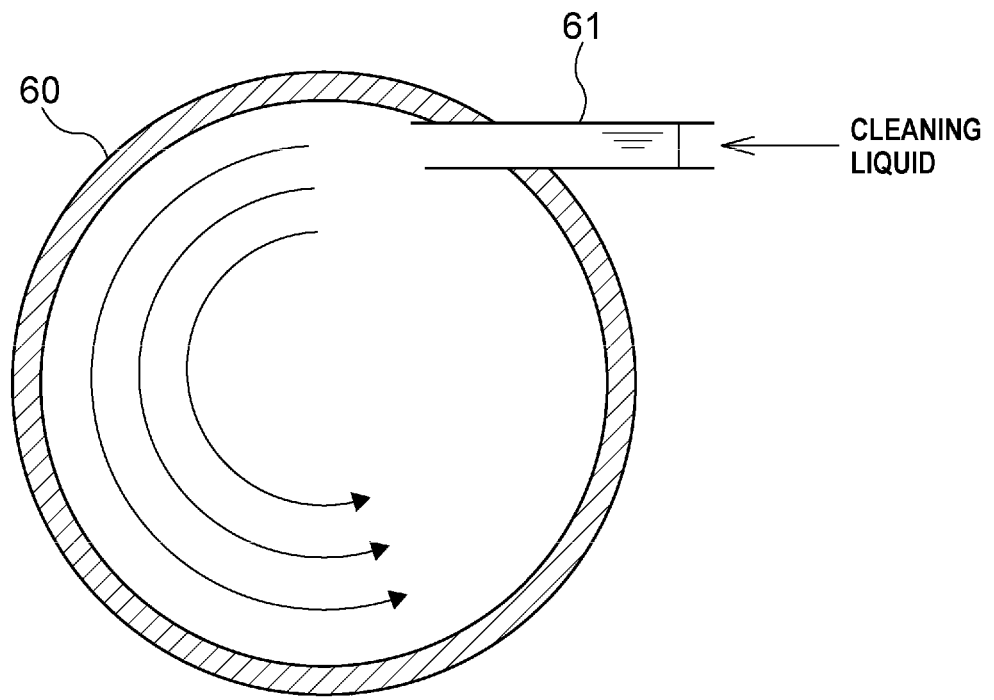
FIG. 8 is a schematic cross-sectional view showing an example of a positional relationship between the cleaning tank and a cleaning-liquid supply line.

FIG. 8 is a schematic cross-sectional view showing an example of a positional relationship between the cleaning tank 60 and the cleaning-liquid supply line 61. As shown in FIG. 8, the cleaning-liquid supply line 61 preferably penetrates the side wall of the cleaning tank 60 so that the cleaning liquid is discharged in a tangential direction of the cleaning tank 60. With this configuration, a swirling flow of the cleaning liquid along the inner surface of the cleaning tank 60 can be generated in the cleaning tank 60 in which the bottom surface of the heat exchanger 11 is immersed. This swirling flow enables dirt attached to the bottom surface of the heat exchanger 11 to be effectively removed.

Figure 9A:
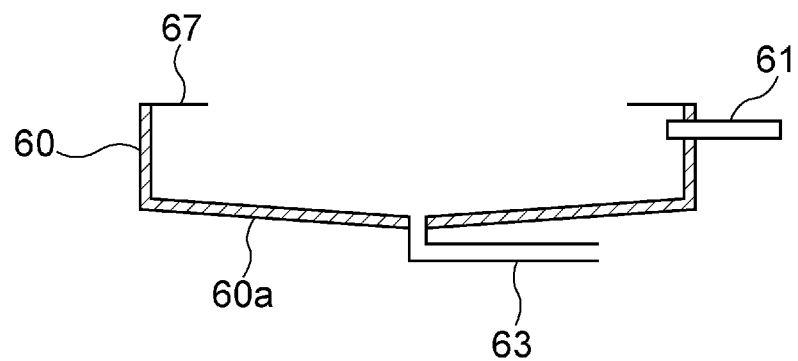
FIG. 9A is a schematic cross-sectional view showing the cleaning mechanism, which includes the cleaning tank, according to still another embodiment.
Figure 9B:
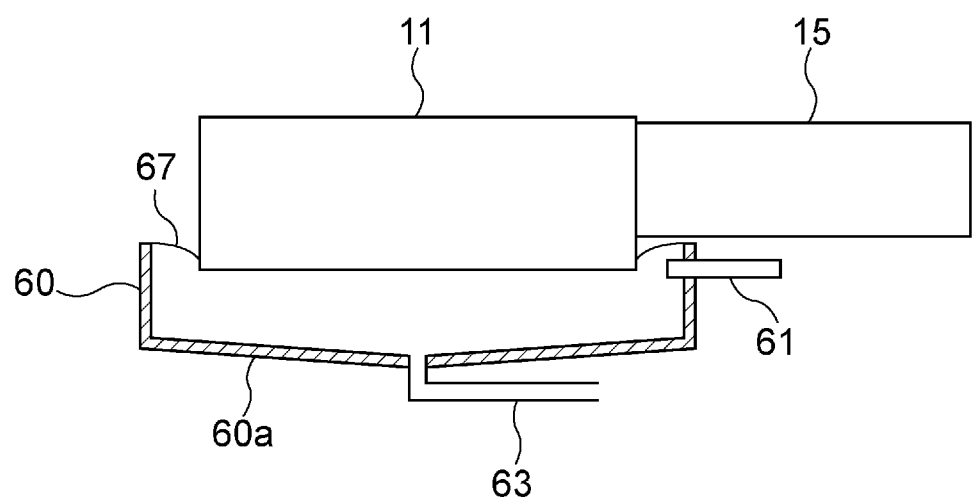
FIG. 9B is a schematic view showing a state in which a bottom surface of the heat exchanger has entered the cleaning tank shown in FIG. 9A.

FIG. 9A is a schematic cross-sectional view showing the cleaning mechanism, which includes the cleaning tank 60, according to still another embodiment, and FIG. 9B is a schematic view showing a state in which the bottom surface of the heat exchanger 11 has entered the cleaning tank 60 shown in FIG. 9A. The cleaning tank 60 shown in FIGS. 9A and 9B corresponds to a modification of the cleaning tank 60 shown in FIG. 7A. Structures of this embodiment, which will not be specifically described, are the same as those of the embodiment shown in FIG. 7A, and duplicate explanations will be omitted.

As shown in FIG. 9A, a ring member 67 having an annular shape is attached to an upper portion of the cleaning tank 60. More specifically, the outer edge of the ring member 67 is fixed to the upper end of the cleaning tank 60. The ring member 67 has flexibility, and a diameter of an inner peripheral surface of the ring member 67 is smaller than an outer diameter of the heat exchanger 11. As shown in FIG. 9B, when the heat exchanger 11 is moved downward by the elevating mechanism 23 and enters the cleaning tank 60, the inner peripheral surface of the ring member 67 having flexibility is pushed downwardly, while being in contact with the outer peripheral surface of the heat exchanger 11. The ring member 67 contacting the outer peripheral surface of the heat exchanger 11 serves as a seal member that prevents the cleaning liquid from overflowing beyond the side wall of the cleaning tank 60. The ring member 67 shown in FIGS. 9A and 9B may be provided in the cleaning tank 60 shown in FIG. 7B.

Figure 10A:
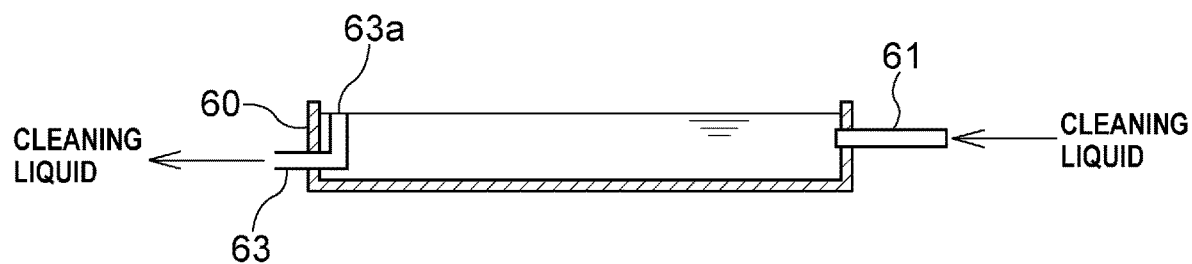
FIGS. 10A and 10B are schematic cross-sectional views each showing the cleaning mechanism, which includes the cleaning tank, according to still another embodiments.
Figure 10B:
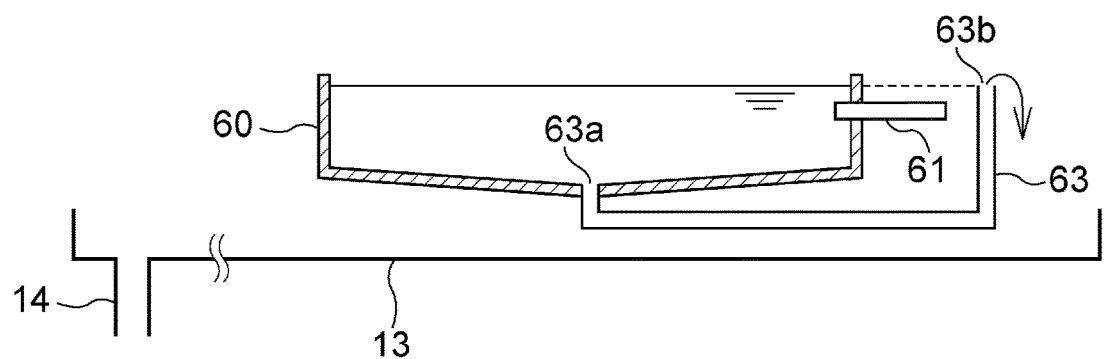

FIGS. 10A and 10B are schematic cross-sectional views each showing the cleaning mechanism 10, which includes a cleaning tank 60, according to still another embodiment. In the cleaning tank 60 shown in FIG. 10A, the inlet 63a of the cleaning-liquid discharge line 63 is opened inside the cleaning tank 60. More specifically, the cleaning-liquid discharge line 63 penetrates the side wall of the cleaning tank 60, and the inlet 63a of the cleaning-liquid discharge line 63 opens at a position lower than the upper end of the side wall of the cleaning tank 60. As shown in FIG. 10A, the inlet 63a of the cleaning-liquid discharge line 63 is preferably arranged at a position higher than the cleaning-liquid supply line 61. The cleaning liquid supplied to the cleaning tank 60 through the cleaning-liquid supply line 61 is stored in the cleaning tank 60, and the level of the cleaning liquid in the cleaning tank 60 rises. When the level of the cleaning liquid reaches the inlet 63a of the cleaning-liquid discharge line 63, the cleaning liquid is drained from the cleaning tank 60 through the cleaning-liquid discharge line 63.

In the cleaning tank 60 shown in FIG. 10B, the inlet 63a of the cleaning-liquid discharge line 63 is coupled to the lowermost end of the cleaning tank 60, and the outlet 63b opens at a position higher than the inlet 63a and lower than the upper end of the side wall of the cleaning tank 60. As shown in FIG. 10B, the outlet 63b of the cleaning-liquid discharge line 63 is preferably arranged at a position higher than the cleaning-liquid supply line 61. The cleaning-liquid supplied to the cleaning tank 60 through the cleaning-liquid supply line 61 flows from the cleaning tank 60 into the cleaning-liquid discharge line 63. On the other hand, since the outlet 63b of the cleaning-liquid discharge line 63 is arranged at a position higher than the inlet 63a, the level of the cleaning liquid in the cleaning tank 60 and the level of the cleaning liquid in the cleaning-liquid discharge line 63 gradually rise until they reach the outlet 63b of the cleaning-liquid discharge line 63. When these levels of the cleaning liquid reach the outlet 63b of the cleaning-liquid discharge line 63, the cleaning liquid overflows from the outlet 63b, and rising of the level of the cleaning liquid in the cleaning tank 60 is stopped. The cleaning liquid that has overflowed from the outlet 63b of the cleaning-liquid discharge line 63 is collected by the collection pan 13 and drained from the polishing apparatus through a drain 14 coupled to the collection pan 13.

Figure 11A:
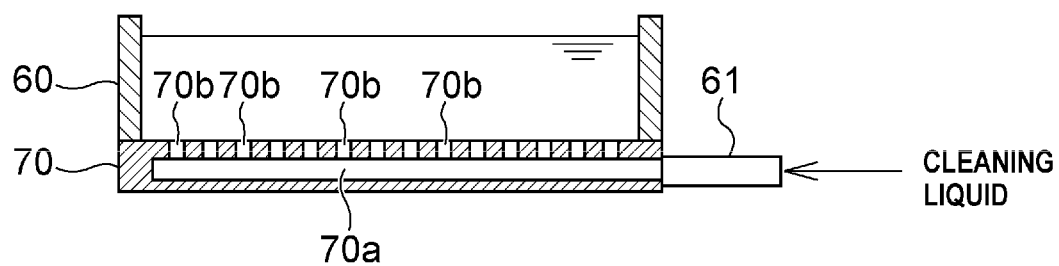
FIGS. 11A and 11B are schematic cross-sectional views each showing the cleaning mechanism, which includes the cleaning tank, according to still another embodiment.
Figure 11B:
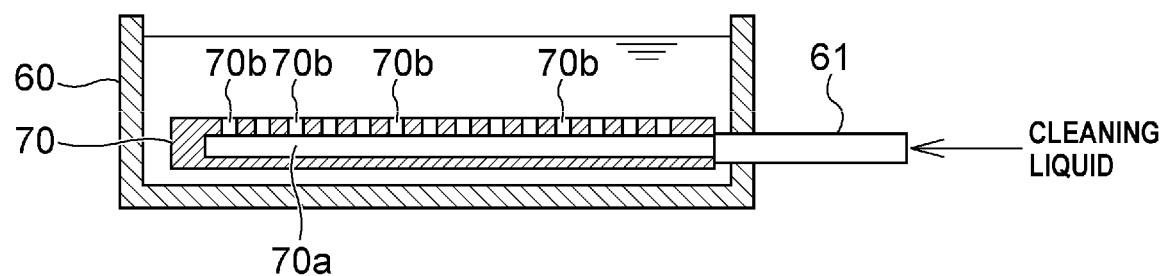

FIGS. 11A and 11B are schematic cross-sectional views each showing the cleaning mechanism 10, which includes the cleaning tank 60, according to still another embodiment. The cleaning tank 60 shown in FIG. 11A is constructed of a main body having a cylindrical shape, and a plate member 70 for closing the bottom of the main body. The plate member 70 shown in FIG. 11A has a disk shape having the same outer diameter as the outer diameter of the main body of the cleaning tank 60, and has a flow passage 70a formed therein. The flow passage 70a extends in the radial direction through the center of the plate member 70. The cleaning-liquid discharge line 61 is coupled to an inlet (opening) of a flow passage 70a formed in the outer peripheral surface of the plate member 70. Further, the plate member 70 has a plurality of holes 70b extending from the flow passage 70a to an upper surface of the plate member 70. The flow passage 70a communicates with the inside of the cleaning tank 60 through the plurality of holes 70b. The cleaning liquid flowing into the flow passage 70a through the cleaning-liquid supply line 61 is supplied into the cleaning tank 60 through the plurality of holes 70b. With this configuration, the cleaning liquid stored in the cleaning tank 60 is agitated by the cleaning liquid discharged from the plurality of holes 70b, so that dirt attached to the bottom surface of the heat exchanger 11 can be effectively removed.

In the cleaning tank 60 shown in FIG. 11B, a plate member 70 having the flow passage 70a and the plurality of holes 70b is disposed inside the cleaning tank 60 having a bottomed cylindrical shape. In this embodiment, the shape of the plate member 70 is arbitrary. For example, the plate member 70 may have a disk shape or a rod shape. When the plate member 70 has a disk shape, the plate member 70 has a diameter smaller than the inner diameter of the cleaning tank 60. When the plate member 70 has a rod shape, the plate member 70 has a length smaller than the inner diameter of the cleaning tank 60. The cleaning-liquid supply line 61 penetrates the side wall of the cleaning tank 60 to be coupled to the flow passage 70a of the plate member 70.

Although the depiction of the cleaning-liquid discharge line 63 has been omitted from FIGS. 11A and 11B, the cleaning tank 60 shown in FIG. 11A or 11B may be surrounded by the overflow tank 64 described with reference to FIG. 7C. In this case, the cleaning-liquid discharge line 63 is coupled to the overflow tank 64. Alternatively, the cleaning tank 60 shown in FIG. 11A or 11B may be provided with the cleaning-liquid discharge line 63 described with reference to FIGS. 10A and 10B. The cleaning tank 60 shown in FIG. 11B may be configured to have the bottom wall 60a described with reference to FIG. 7A or 7B. In this case, the cleaning-liquid discharge line 63 is coupled to the lowermost end of the bottom wall 60a.

In one embodiment, instead of the cleaning-liquid supply line 61, a gas supply line (not shown) may be coupled to the flow passage 70a of the plate member 70. In this case, gas is supplied into the flow passage 70a, and bubbles are discharged from the holes 70b to the cleaning liquid stored in the cleaning tank 60.

Figure 12A:
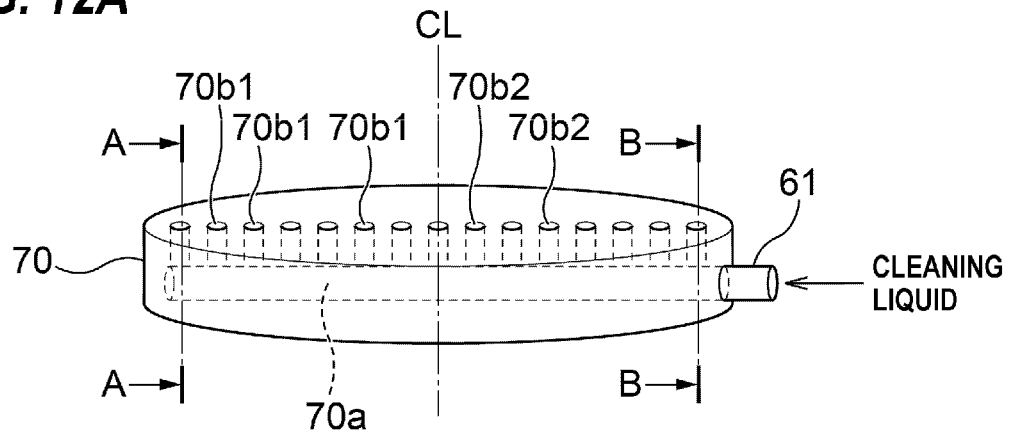
FIG. 12A is a schematic perspective view showing a modification of a plate member.
Figure 12B:
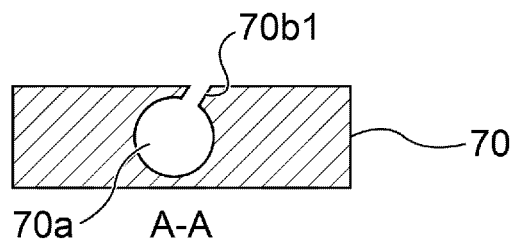
FIG. 12B is a cross-sectional view taken along line A-A of FIG. 12A.
Figure 12C:
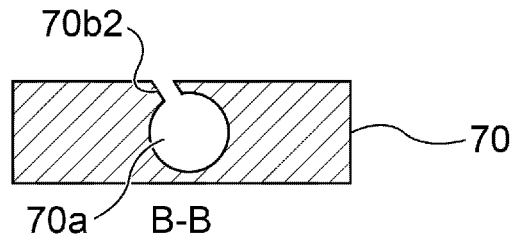
FIG. 12C is a cross-sectional view taken along line B-B of FIG. 12A.
Figure 12D:
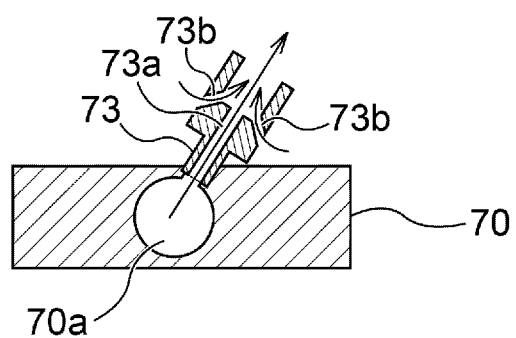
FIG. 12D is a schematic cross-sectional view showing an injection nozzle connected to an outlet of a hole formed in the plate member.

FIG. 12A is a schematic perspective view showing a modification of the plate member 70, FIG. 12B is a cross-sectional view taken along line A-A of FIG. 12A, and FIG. 12C is a cross-sectional view taken along line B-B of FIG. 12A. FIG. 12D is a schematic cross-sectional view showing an injection nozzle connected to the outlet of the hole formed in the plate member 70.

As shown in FIG. 12A, the plurality of holes extending from the flow passage 70a to the surface of the plate member 70 is composed of one group of holes formed of holes 70b1 and the other group of holes formed of holes 70b2. One group of holes formed of the holes 70b1 and the other group of holes formed of the holes 70b2 are arranged from the center line CL of the plate member 70 on the left and right. As shown in FIGS. 12B and 12C, the holes 70b1 extend obliquely with respect to the vertical direction, and the holes 70b2 extend obliquely in a direction opposite to the inclination direction of the holes 70b1. With such a configuration, the cleaning liquid discharged from the holes 70b1 and 70b2 can generate a swirling flow in the cleaning liquid stored in the cleaning tank 60. Therefore, dirt attached to the bottom surface of the heat exchanger 11 can be effectively removed.

It is preferable to connect a jet nozzle 73 shown in FIG. 12D to the holes 70b1 and 70b2, respectively. The jet nozzle 73 includes a main flow passage 73a formed therein, and sub flow passages 73b extending from a side surface of the jet nozzle 73 to the main flow passage 73a. The main flow passage 73a communicates with the hole 70b1 (or the hole 70b2). When the cleaning liquid is supplied into the main flow passage 73a of the jet nozzle 73 from the flow passage 70a and the hole 70b1 (or the hole 70b2) of the plate member 70, a part of the cleaning liquid stored in the cleaning tank 60 is sucked from the sub flow passages 73b, and thus the jet of the cleaning liquid is discharged from an outlet of the jet nozzle 73. As a result, a strong swirling flow is generated in the cleaning liquid stored in the cleaning tank 60, so that dirt attached to the bottom surface of the heat exchanger 11 can be more effectively removed.

Figure 13:
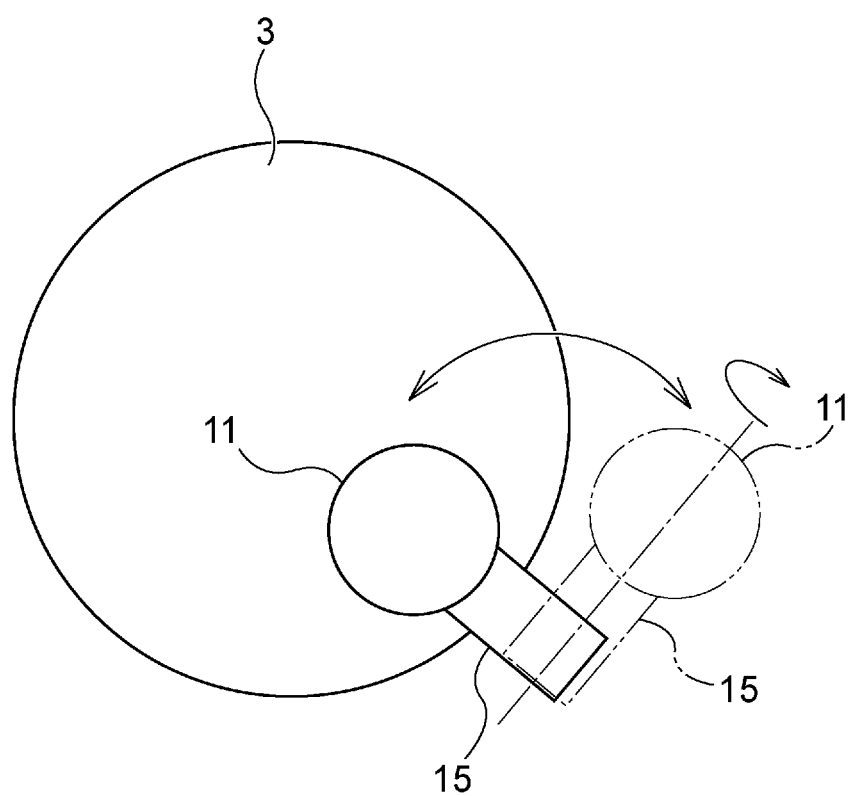
FIG. 13 is a plan view schematically showing another example of state in which the heat exchanger moves to the retreat position.

FIG. 13 is a plan view schematically showing another example of state in which the heat exchanger 11 moves to the retreat position. The polishing apparatus has many apparatuses and devices disposed therein, other than the polishing head 1 and the pad temperature regulating apparatus 5. For example, the polishing apparatus has a dresser (not shown) for regenerating the surface configuration and the condition of the polishing pad 3 which has deteriorated. Therefore, in some cases, the heat exchanger 11 cannot move to the retreat position located on the side of the polishing pad 3, while maintaining the attitude of the heat exchanger 11 horizontal (i.e., maintaining the bottom surface of the heat exchanger 11 horizontal). From this viewpoint, as shown in FIG. 13, the heat exchanger 11 is turned in the vertical direction with respect to the surface of the polishing pad 3 while pivoting the heat exchanger 11 in the horizontal direction with respect to the surface of the polishing pad 3, thereby reducing the moving distance of the heat exchanger 11 in the horizontal direction.

Figure 14A:
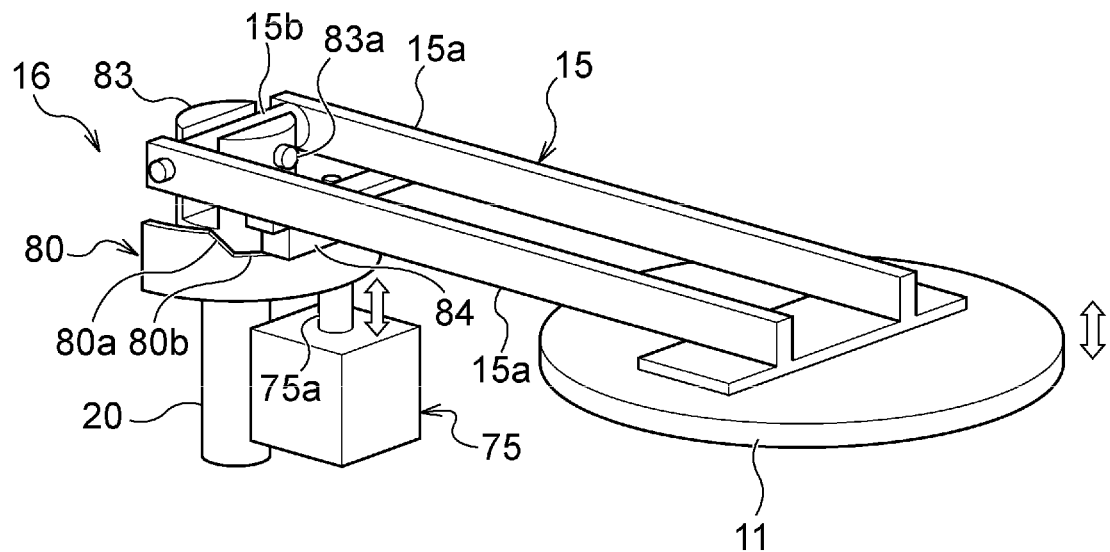
FIG. 14A is a perspective view schematically showing an example of the moving mechanism for turning the heat exchanger with respect to a horizontal direction while moving the heat exchanger in the horizontal direction.
Figure 14B:
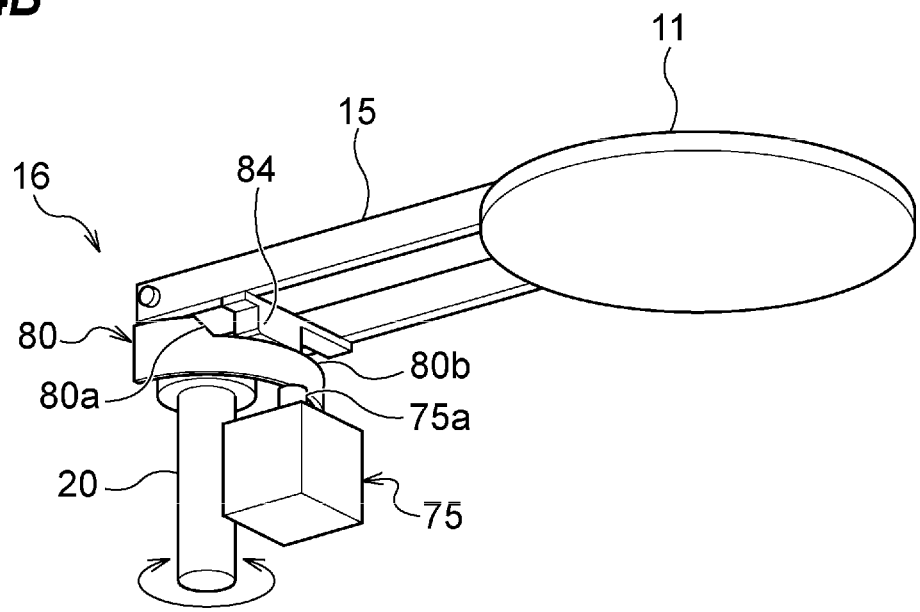
FIG. 14B is a schematic perspective view of the moving mechanism shown in FIG. 14A as viewed from below.
Figure 15:
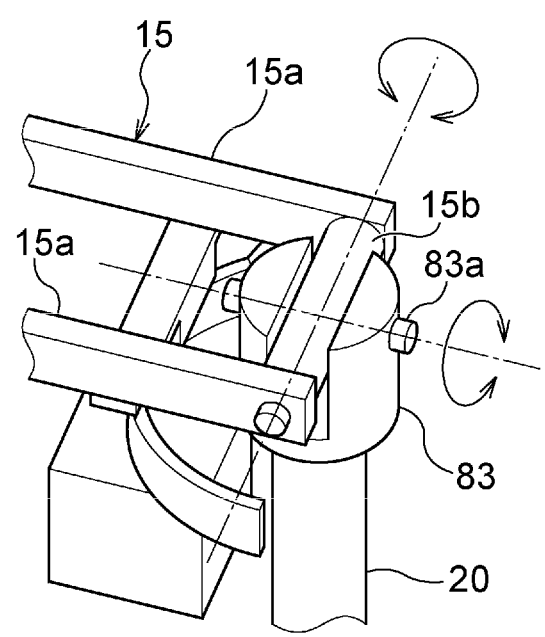
FIG. 15 is an enlarged schematic perspective view showing a coupling part between an arm and a shaft.
Figure 16:
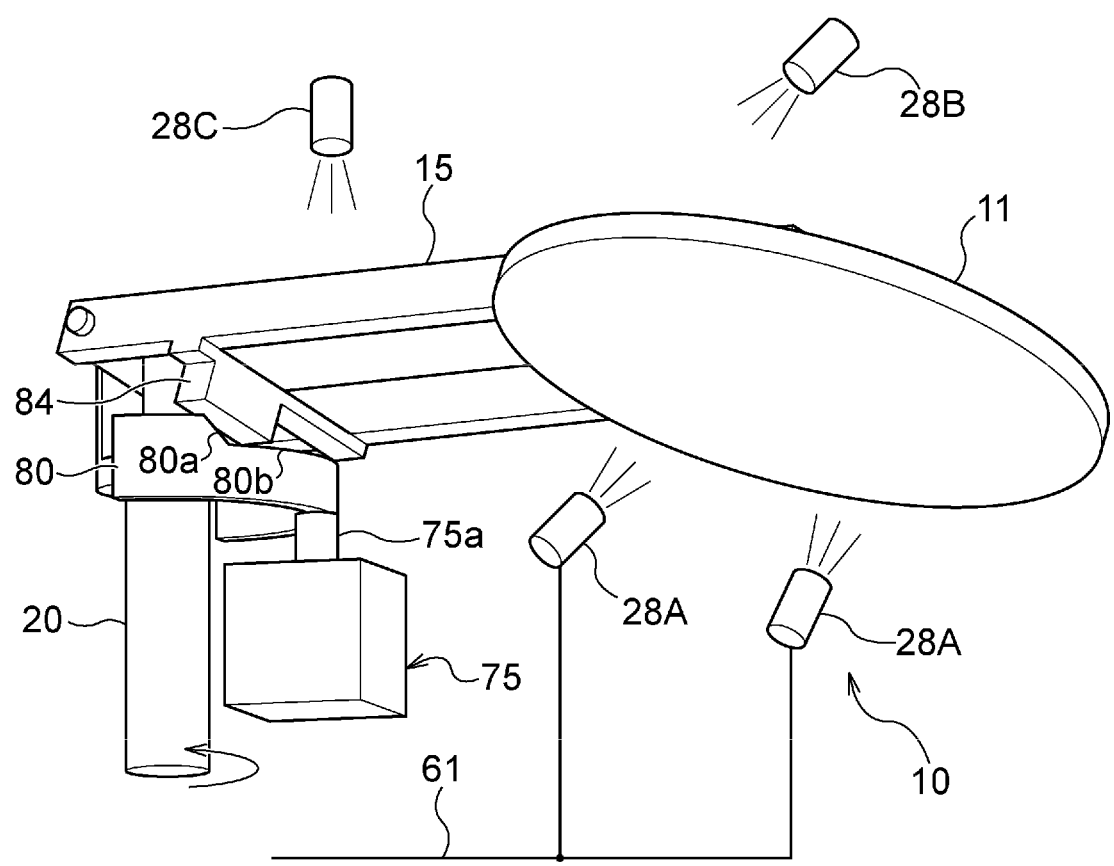
FIG. 16 is a schematic view showing a state in which the cleaning liquid is jetted to the heat exchanger moved to the retreat position shown in FIG. 13.

FIG. 14A is a perspective view schematically showing an example of the moving mechanism 16 for turning the heat exchanger 11 with respect to the horizontal direction while moving the heat exchanger 11 in the horizontal direction. FIG. 14B is a schematic perspective view of the moving mechanism 16 shown in FIG. 14A as viewed from below. FIG. 15 is an enlarged schematic perspective view showing a coupling part between the arm 15 and the shaft 20. FIG. 16 is a schematic view showing a state in which the cleaning liquid is jetted to the heat exchanger moved to the retreat position shown in FIG. 13.

The moving mechanism 16 shown in FIGS. 14A and 14B includes an elevating mechanism 75 for moving the arm 15 and the heat exchanger 11 upward and downward with respect to the polishing pad 3, and a pivoting mechanism for turning the heat exchanger 11 in the vertical direction with respect to the surface of the polishing pad 3 while pivoting the heat exchanger 11 in the horizontal direction with respect to the surface of the polishing pad 3. Although, in FIGS. 14A and 14B, the pivoting mechanism for pivoting the arm 15 and the heat exchanger 11 is omitted from illustration, the moving mechanism 16 according to this embodiment can include, as a part of the pivoting mechanism of the moving mechanism 16, the pivoting mechanism 22 described with reference to FIG. 5 or FIG. 6. The shaft 20 coupled to the arm 15 is configured as a spline shaft, and is supported by the spline bearing 21 (see FIGS. 5 and 6) so as to be vertically movable.

As shown in FIGS. 14A and 15, the arm 15 coupled to the heat exchanger 11 has two rod-shaped members 15a, and a connection shaft 15b that connects the two rod-shaped members 15a to each other. The tip of each rod-shaped member 15a is coupled to the heat exchanger 11 via a plate member, and the connection shaft 15b is fixed to the end of each rod-shaped member 15a. Further, a cam 84 is fixed to lower surfaces of the two rod-shaped members 15a (i.e., a lower surface of the arm 15).

As shown in FIG. 15, the shaft 20 has an upper end to which a support member 83 coupled to the connection shaft 15b of the arm 15 is fixed. The support member 83 has a groove formed therein, which extends downward from the upper surface of the support member 83, and the connection shaft 15b of the arm 15 is inserted into the groove of the support member 83. With the connecting shaft 15b of the arm 15 inserted into the groove of the support member 83, the connecting shaft 15b is fixed to a rotation pin 83a extending through a through hole formed in the support member 83. The rotation pin 83a has an axis orthogonal to the axis of the connection shaft 15b, and is rotatably supported by a through hole of the support member 83. With such a configuration, the arm 15 is pivotably supported with respect to the support member 83.

In this embodiment, the elevating mechanism 75 is a piston-cylinder mechanism having a piston 75a. The piston 75a is inserted into a cylinder of the piston-cylinder mechanism 75 so as to be capable of advancing and retreating with respect to the cylinder, and a fluid supply line (not shown) is coupled to the cylinder of the piston-cylinder mechanism 75. The piston-cylinder mechanism 75 further has a guide plate 80 fixed to the tip of the piston 75a. The guide plate 80 is a plate having an arc shape, and has a cutout formed on the upper surface thereof. The cutout is composed of a horizontal portion 80b extending in an arc shape, and an inclined portion 80a extending obliquely upward from the horizontal portion 80b. When the heat exchanger 11 lies in the temperature regulating position in which it contacts the surface of the polishing pad 3, the cam 84 fixed to the lower surface of the arm 15 is placed in contact with the horizontal portion 80b of the cutout in the guide plate 80.

When the fluid is supplied to the cylinder of the piston-cylinder mechanism 75, the piston 75a rises, and thus the arm 15 and the heat exchanger 11 coupled to one end of the arm 15 is raised through the guide plate 80. Since the shaft 20 coupled to the other end of the arm 15 is supported by the ball spline bearing (see FIGS. 4 and 5) which supports the shaft 20 so as to be movable in the vertical direction, rising of the arm 15 causes the shaft 20 to be raised.

Next, in order to pivot the arm 15 and the heat exchanger 11, the shaft 20 is rotated. When the shaft 20 is rotated, the arm 15 coupled to the shaft 20 via the support member 83 is pivoted, and the cam 84 fixed to the lower surface of the arm 15 moves along the horizontal portion 80b of the guide plate 80. During moving of the cam 84 on the horizontal portion 80b, the arm 15 and the heat exchanger 11 are pivoted while maintaining their horizontal attitude.

When the shaft 20 is further rotated, an end of the cam 84 fixed to the lower surface of the arm 15 collides with the inclined portion 80a, and thus the cam 84 and the arm 15 attempt to be turned with respect to the horizontal direction such that the end of the cam 84 rises along the inclined portion 80a. During this operation, the connection shaft 15b of the arm 15 rotates around the axis of the rotation pin 83a in the groove of the support member 83. As a result, as shown in FIG. 16, the heat exchanger 11 coupled to the arm 15 is turned so that the bottom surface of the heat exchanger 11 faces upward with respect to the horizontal direction. In this embodiment, the retreat position is a position in which the bottom surface of the heat exchanger 11 is turned obliquely upward from a horizontal position parallel to the surface of the polishing pad 3, and the cleaning liquid nozzle 28A of the cleaning mechanism 10 ejects the cleaning liquid toward the bottom surface of the heat exchanger 11 lying in the retreat position. In this embodiment also, the cleaning mechanism 10 may have at least one cleaning liquid nozzle 28B for ejecting the cleaning liquid onto the upper surface and/or the side surface of the heat exchanger 11, and may have at least one cleaning liquid nozzle 28C for ejecting the cleaning liquid onto the arm 15.

In the moving mechanism 16 shown in FIGS. 14A and 14B, the connecting shaft 15b is fixed to the end of each bar-shaped member 15a, but this embodiment is not limited to this example. In one embodiment, the connection shaft 15b may rotatably support each bar-shaped member 15a. In this case, when the piston 75a of the piston-cylinder mechanism 75 is raised, the two rod-shaped members 15a and the heat exchanger 11 pivot upward around the axis of the connecting shaft 15b through the guide plate 80. The bottom surface of the heat exchanger 11 is directed obliquely upward with respect to the surface of the polishing pad 3. On the other hand, the shaft 20 does not rise with the rising operation of the piston 75a. When the shaft 20 is rotated in this state, the heat exchanger 11 is pivoted about the shaft 20 in the horizontal direction during moving of the cam 84 on the horizontal portion 80b. When the shaft 20 is further rotated, the end of the cam 84 rises along the inclined portion 80a, and thus the heat exchanger 11 is turned in the vertical direction with respect to the surface of the polishing pad 3.

Figure 17A:
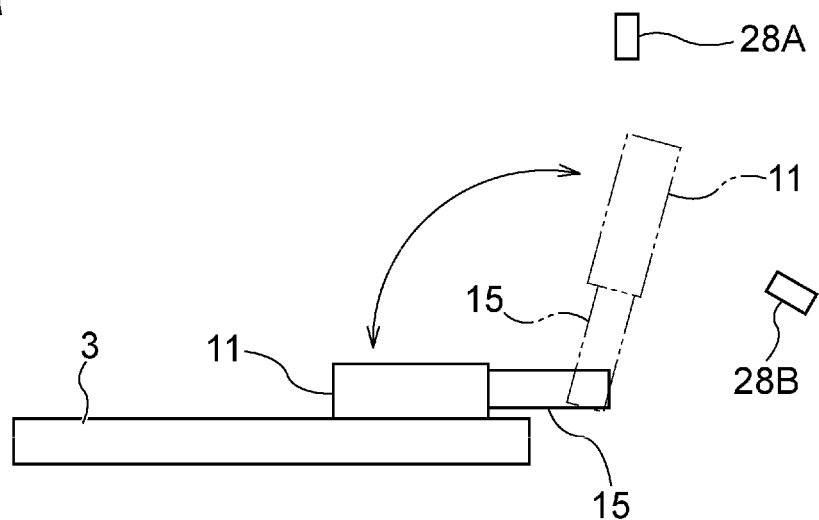
FIG. 17A is a side view schematically showing still another example of a state in which the heat exchanger moves to the retreat position.
Figure 17B:
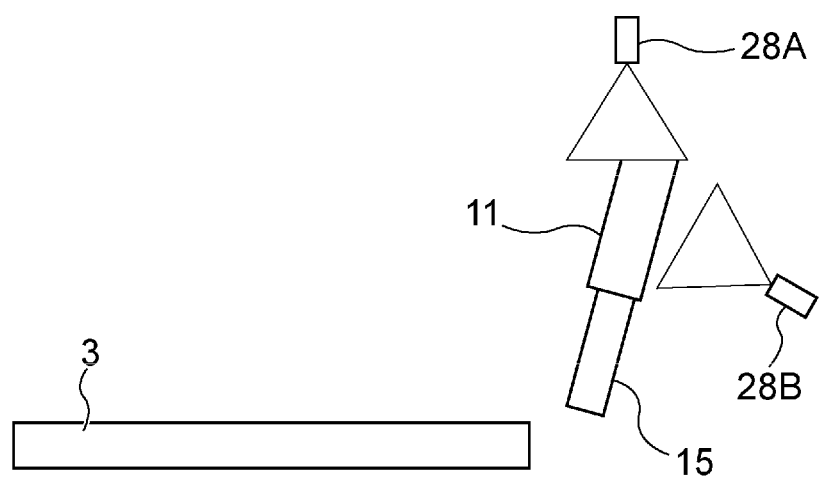
FIG. 17B is a schematic view showing a state in which the cleaning liquid is ejected onto the heat exchanger moved to the retreat position shown in FIG. 17A.

FIG. 17A is a side view schematically showing still another example of a state in which the heat exchanger 11 moves to the retreat position. FIG. 17B is a schematic view showing a state in which the cleaning liquid is ejected onto the heat exchanger 11 moved to the retreat position shown in FIG. 17A.

As shown in FIG. 17A, the heat exchanger 11 may be vertically rotated around the end of the arm 15 as a fulcrum. In this case, it is preferable that the heat exchanger 11 is rotated by 90° or more from a horizontal position where the bottom surface of the heat exchanger 11 is parallel to the surface of the polishing pad 3, such that the bottom surface of the heat exchanger 11 faces obliquely upward with respect to the vertical direction. In this embodiment, the retreat position is a position where the heat exchanger 11 is pivoted upward around the end of the arm 15 as a fulcrum (see the heat exchanger 11 indicated by a two-dot chain line in FIG. 17A).

As shown in FIG. 17B, the cleaning liquid is ejected from the cleaning liquid nozzle 28A onto the bottom surface of the heat exchanger 11 moved to the retracted position to thereby clean dirt adhering to the bottom surface of the heat exchanger 11. In this embodiment also, the cleaning mechanism 10 may have at least one cleaning liquid nozzle 28B for ejecting the cleaning liquid onto the upper surface and/or the side surface of the heat exchanger 11. Although, in FIGS. 17A and 17B, the above-mentioned cleaning liquid nozzle 28C is omitted from illustration, the cleaning mechanism 10 may have at least one cleaning liquid nozzle 28C for ejecting the cleaning liquid onto the arm 15.

Figure 18:
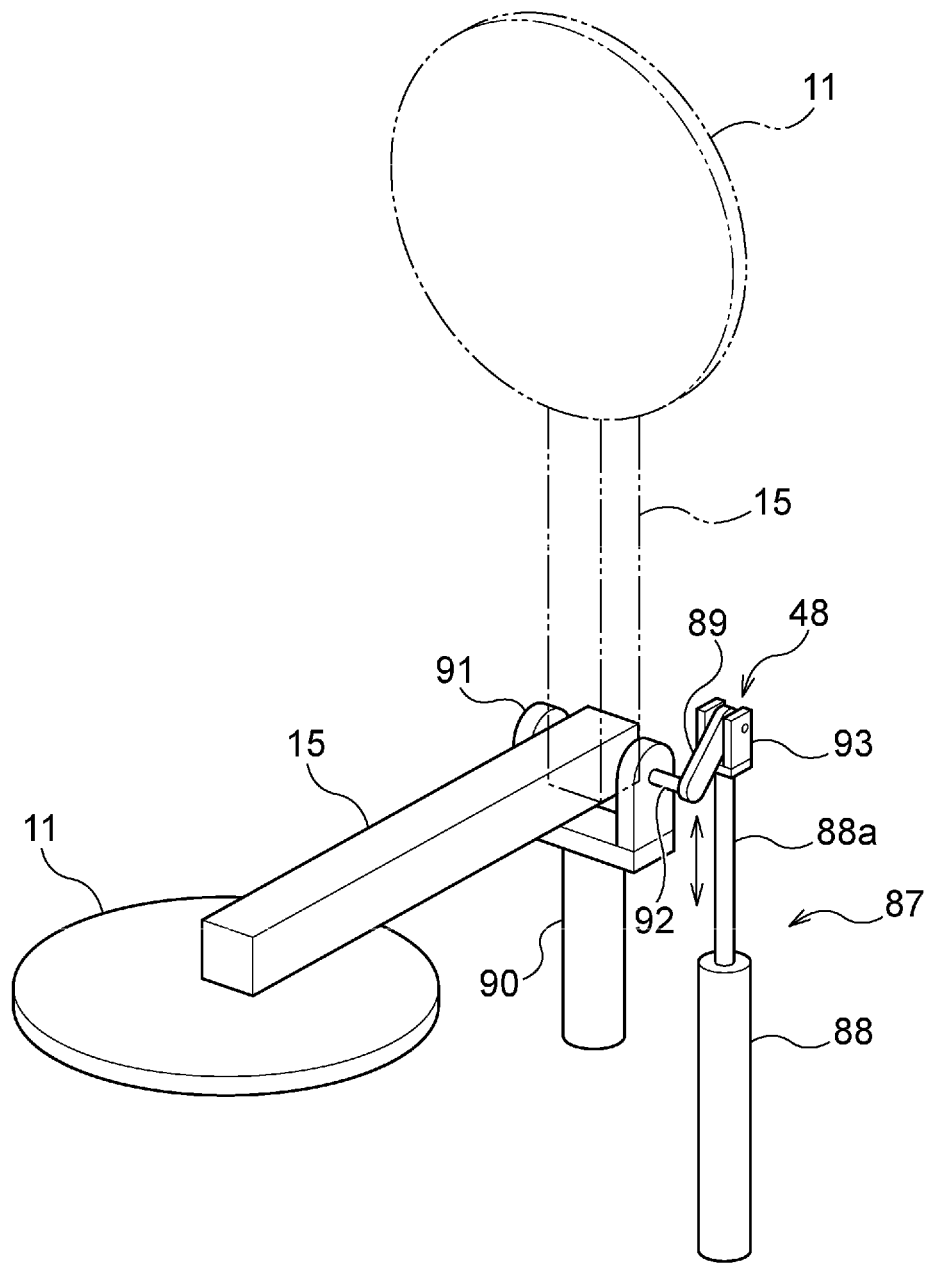
FIG. 18 is a schematic perspective view showing an example of the moving mechanism for moving the heat exchanger to the retreat position shown in FIGS. 17A and 17B.

FIG. 18 is a schematic perspective view showing an example of the moving mechanism for moving the heat exchanger 11 to the retreat position shown in FIGS. 17A and 17B. The moving mechanism 87 shown in FIG. 18 includes a piston-cylinder mechanism 88 having a piston 88a, and a link mechanism 48 for converting movement of the piston 88a into pivot movement of the arm 15 to which the heat exchanger 11 is coupled.

In this embodiment, the arm 15 is rotatably coupled to a support member 91 fixed to an upper end of a support rod 90. Specifically, the support member 91 has a substantially C-shaped cross-sectional shape which has two protrusions, and the end of the arm 15 is fixed to the rotational shaft 92 which is rotatably supported by the two protrusions of the support member 91.

To the cylinder of the piston-cylinder mechanism 88, a fluid (for example, compressed air, and nitrogen gas) used for moving the piston 88a upward and downward is supplied from a fluid supply source (not shown). When the fluid is supplied to the piston-cylinder mechanism 88, the piston 88a rises, and when the supply of the fluid to the piston-cylinder mechanism 88 is stopped, the piston 88a is lowered.

The link mechanism 48 shown in FIG. 18 is composed of a coupling member 93 fixed to a tip of a piston 88a, a crank 89 rotatably supported to the coupling member 93, and the afore-mentioned rotational shaft 92 fixed to the crank 89. The coupling member 93 has two plate-like bodies extending upward from a base body. One end of the crank 89 is fixed to the rotational shaft 92, and the other end of the crank 89 is fixed to a rotational pin which is rotatably supported to the two plate-like bodies of the coupling member 93. When the supply of the fluid to the piston-cylinder mechanism 88 is stopped to lower the piston 88a, the coupling member 93 fixed to the piston 88a is also lowered. At the same time, the crank 89 rotates around a rotational pin disposed between the two plate-like bodies of the coupling member 93, thereby rotating the rotating shaft 92 fixed to one end of the crank 89. The rotating movement of the rotational shaft 92 causes the arm 15 to be pivoted around an axis of the rotational shaft 92, thereby moving the heat exchanger 11 to the retreat position separated from the surface of the polishing pad 3.

Figure 19A:
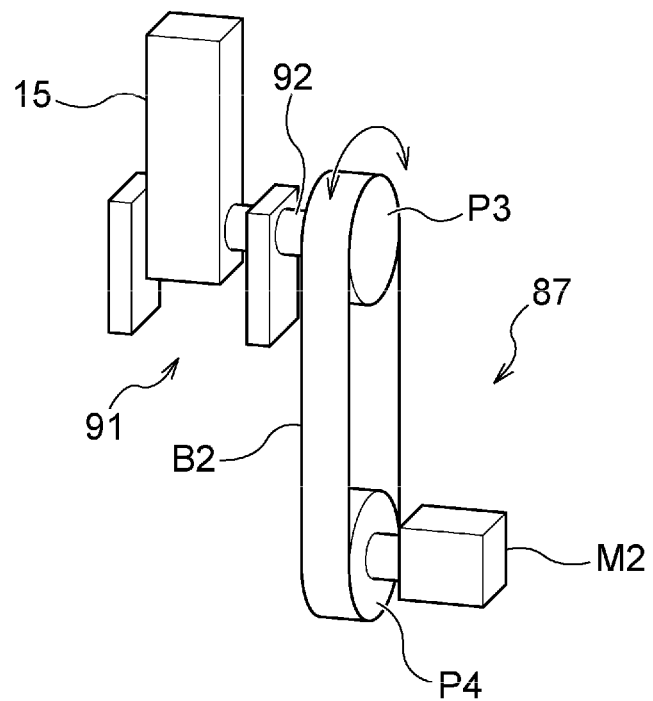
FIG. 19A is a view schematically showing a modification of the moving mechanism shown in FIG. 18.
Figure 19B:
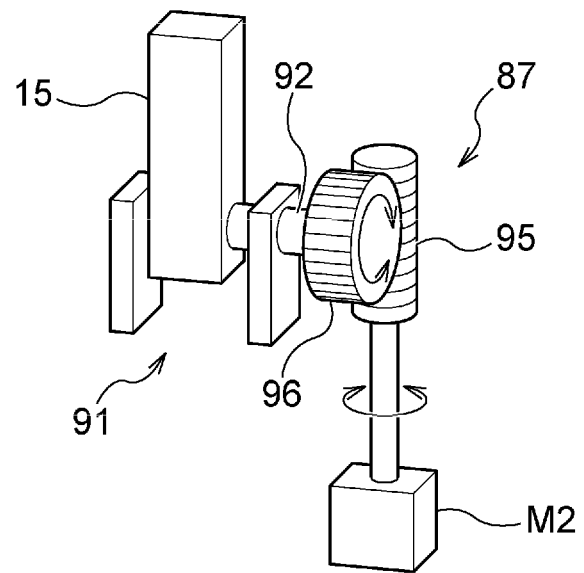
FIG. 19B is a view schematically showing another modification of the moving mechanism shown in FIG. 18.

FIG. 19A is a view schematically showing a modification of the moving mechanism 87 shown in FIG. 18, and FIG. 19B is a view schematically showing another modification of the moving mechanism 87 shown in FIG. 18. The moving mechanism 87 shown in FIGS. 19A and 19B includes an electric motor M2, respectively. The electric motor M2 is set in motion to thereby pivot the arm 15 and the heat exchanger 11 to the retreat position.

The moving mechanism 87 shown in FIG. 19A includes the motor M2, the rotational shaft 92 fixed to the distal end of the arm 15 and rotatably supported by two plate-like bodies of the support member 91, a third pulley P3 fixed to the rotational shaft 92, a fourth pulley P4 fixed to a rotational shaft of the motor M2, and a belt B2 riding on these pulleys P3 and P4. When the motor M2 is set in motion, the fourth pulley P4 is rotated, the rotation of the fourth pulley P4 is transmitted to the third pulley P3 through the belt B2, and the third pulley P3 is rotated. When the third pulley P3 is rotated, the rotational shaft 92 is rotated, thereby causing the arm 15 and the heat exchanger 11 to be pivoted in the vertical direction. The rotational shaft of the motor M2 is rotated clockwise or counterclockwise, thereby enabling the heat exchanger 11 to be pivoted about the rotational shaft 92 so as to be approached to or separated from the polishing pad 3.

The moving mechanism 87 shown in FIG. 19B includes the motor M2, the rotational shaft 92 fixed to the distal end of the arm 15 and rotatably supported by two plate-shaped members of the support member 91, a worm wheel 96 fixed to the rotating shaft 92, and a worm 95 fixed to the rotating shaft of the motor M2. The worm wheel 96 has a helical tooth that can be engaged with the tooth of the worm 95, and the worm 95 and the worm wheel 96 constitute a worm gear. When the motor M2 is set in motion, the worm 95 is rotated, and the rotation of the worm 95 is transmitted to the rotational shaft 92 through the worm wheel 96, thereby causing the arm 15 and the heat exchanger 11 to be pivoted. In this embodiment also, the rotational shaft of the motor M2 is rotated clockwise or counterclockwise, thereby enabling the heat exchanger 11 to be pivoted about the rotational shaft 92 so as to be approached to or separated from the polishing pad 3.

Figure 20A:
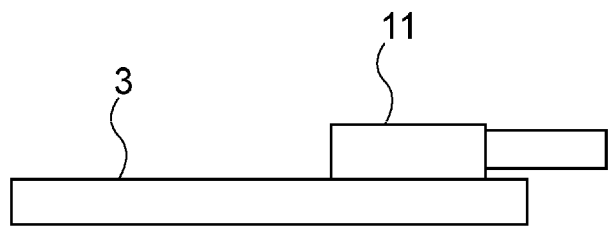
FIG. 20A is a schematic view showing a state in which the heat exchanger lies in a temperature regulating position where the heat exchanger contacts the surface of the polishing pad.
Figure 20B:
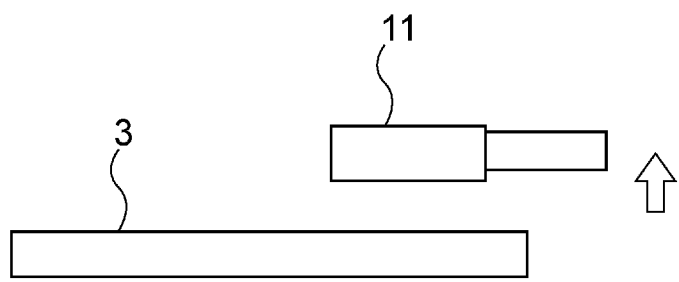
FIG. 20B is a schematic view showing a state in which the heat exchanger is moved above the polishing pad.
Figure 20C:
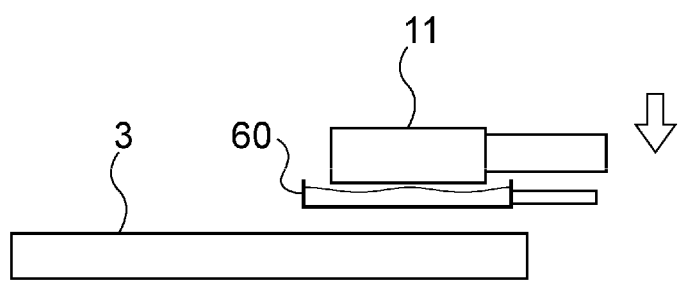
FIG. 20C is a schematic view showing a state in which the heat exchanger lies in the retreat position.

FIGS. 20A through 20C are schematic views each showing a state in which the heat exchanger 11 is moved to the retreat position located above the polishing pad 3 and the bottom surface of the heat exchanger 11 lying in the retreat position is cleaned in the cleaning tank 60. More specifically, FIG. 20A is a schematic view showing a state in which the heat exchanger 11 lies in the temperature regulating position where the heat exchanger 11 contacts the surface of the polishing pad 3, FIG. 20B is a schematic view showing a state in which the heat exchanger 11 is moved above the polishing pad 3, and FIG. 20C is a schematic view showing a state in which the heat exchanger 11 lies in the retreat position.

If a space for retreating the heat exchanger 11 cannot be allowed beside the polishing pad 3, the heat exchanger 11 is moved above the polishing pad 3. In this case, the retreat position is a position in which the heat exchanger 11 is located above the polishing pad 3. Although, in FIGS. 20A through 20C, the elevating mechanism (moving mechanism) for moving the heat exchanger 11 upward is omitted from illustration, an example of such elevating mechanism includes a linear cylinder mechanism or a ball screw mechanism each for vertically moving the arm 15 coupled to the heat exchanger 11.

As shown in FIG. 20A, during polishing of the wafer W, the heat exchanger 11 lies in the temperature regulating position in which it contacts with the surface of the polishing pad 3. In this embodiment, after completing the polishing of the wafer W, the heat exchanger 11 is moved above the polishing pad 3 by an elevating mechanism (not shown) (see FIG. 20B). Next, the cleaning tank 60 is moved between the heat exchanger 11 and the polishing pad 3 by a horizontal moving mechanism (not shown). The heat exchanger 11 is lowered by the elevating mechanism until the bottom surface thereof is immersed in the cleaning liquid in the cleaning tank 60 (see FIG. 20C). Any of the cleaning tanks 60 shown in FIGS. 7 through 12 can be used as the cleaning tank 60 shown in FIG. 20C.

In some cases, dirt firmly adheres to the bottom surface of the heat exchanger 11. From this viewpoint, the cleaning mechanism 10 may include a cleaning member, such as a cleaning brush, a cleaning roller, a cleaning pad, or a nonwoven fabric, for cleaning the bottom surface of the heat exchanger 11.

Figure 21A:
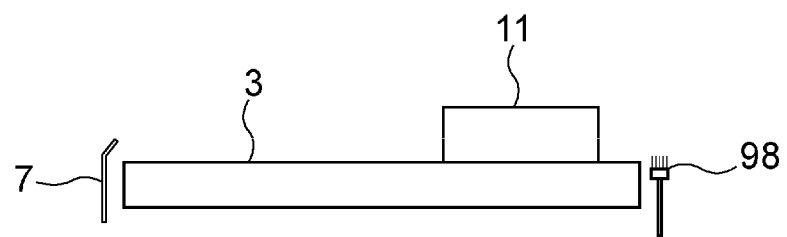
FIG. 21A is a schematic view showing an example of a cleaning brush for cleaning the bottom surface of the heat exchanger.
Figure 21B:
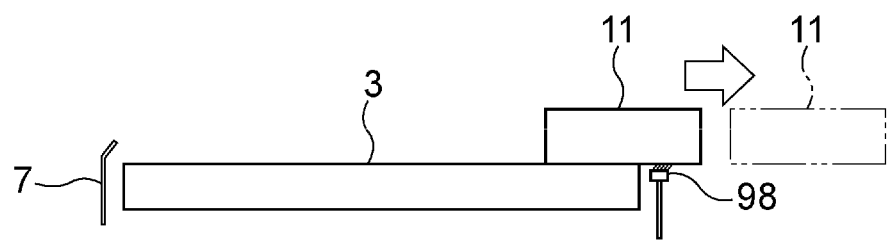
FIG. 21B is a schematic view showing a state in which the cleaning brush shown in FIG. 21A is cleaning dirt attached to the bottom surface of the heat exchanger.

FIG. 21A is a schematic view showing an example of a cleaning brush for cleaning the bottom surface of the heat exchanger 11, and FIG. 21B is a schematic view showing a state in which the cleaning brush shown in FIG. 21A is cleaning dirt attached to the bottom surface of the heat exchanger 11.

The cleaning brush 98 shown in FIG. 21A is disposed in a cutout formed in an upper part of the cylindrical cup 7 (see FIGS. 1 and 2). The moving mechanism 16 shown in FIGS. 4 through 6 includes the pivoting mechanism 22 for pivoting the heat exchanger 11. Thus, the cutout is provided at a portion where the path of the heat exchanger 11 pivoted by the above-described pivoting mechanism 22 intersects the cylindrical cup 7, and further the cleaning brush 98 capable of contacting the bottom surface of the heat exchanger 11 is disposed in the cutout. The cleaning brush 98 contacts the bottom surface of the heat exchanger 11 during moving from the temperature regulating position to the retreat position, thereby scraping off dirt attached to the bottom surface. It is preferable that the cleaning liquid is supplied to the cleaning brush 98. For example, the cylindrical cup 7 has a flow passage, formed therein, of the cleaning liquid extending to the cutout, and thus, the cleaning liquid is supplied to the cleaning brush 98 through the flow passage. Although not shown, a cleaning liquid nozzle capable of ejecting the cleaning liquid may be provided at a contact portion between the cleaning brush 98 and the bottom surface of the heat exchanger 11.

In one embodiment, the cleaning mechanism 10 may further include the cleaning nozzle 28A or the cleaning tank 60 which is described above, and further may include the cleaning nozzles 28B and 28C.

When moving the cleaned heat exchanger 11 from the retreat position to the temperature regulating position, the heat exchanger 11 is once raised and then pivoted to a position above the polishing pad 3. After that, the heat exchanger 11 is moved downwardly toward the polishing pad 3 to reach the temperature regulating position. Since the heat exchanger 11 is moved to the temperature regulating position after it is once raised, the cleaned heat exchanger 11 is prevented from contacting the cleaning brush 98. As a result, the cleaned heat exchanger 11 is prevented from being contaminated by dirt attached to the cleaning brush 98.

Figure 22A:
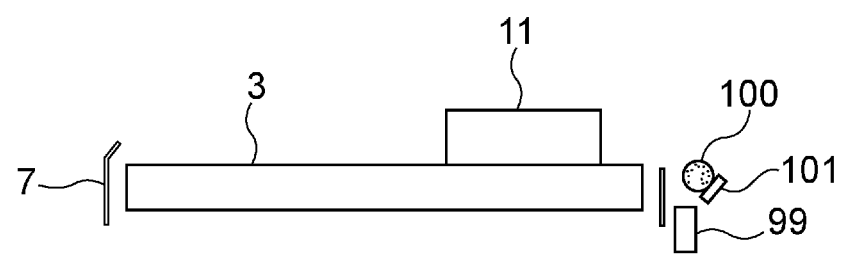
FIG. 22A is a schematic view showing an example of a cleaning roller for cleaning the bottom surface of the heat exchanger.
Figure 22B:
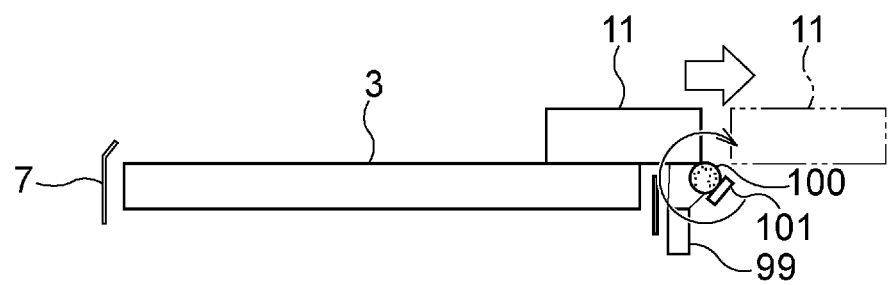
FIG. 22B is a schematic view showing a state in which the cleaning roller shown in FIG. 22A is cleaning dirt attached to the bottom surface of the heat exchanger.

FIG. 22A is a schematic view showing an example of a cleaning roller for cleaning the bottom surface of the heat exchanger 11, and FIG. 22B is a schematic view showing a state in which the cleaning roller shown in FIG. 22A is cleaning dirt attached to the bottom surface of the heat exchanger 11. The embodiment shown in FIGS. 22A and 22B corresponds to a modification of the embodiment shown in FIGS. 21A and 21B. Structures of this embodiment, which will not be specifically described, are the same as those of the embodiment shown in FIGS. 21A and 21B, and duplicate explanations will be omitted.

The cleaning roller 100 shown in FIG. 22A is disposed in the middle of the path of the heat exchanger 11 pivoted by the above-described pivoting mechanism 22. The cleaning roller 100 is rotatably supported by a bearing (not shown). Further, the cleaning mechanism 10 has a cleaning liquid nozzle 99 for ejecting the cleaning liquid to a contact portion between the cleaning roller 100 and the heat exchanger 11. When the bottom surface of the heat exchanger 11 contacts the cleaning roller 100 during moving of the heat exchanger 11 from the temperature regulating position to the retreat position, the cleaning roller 100 rotates and scrapes dirt attached to the bottom surface of the heat exchanger 11. During this operation, the cleaning liquid nozzle 99 ejects the cleaning liquid to a contact portion between the cleaning roller 100 and the heat exchanger 11 in order to effectively remove dirt attached to the bottom surface of the heat exchanger 11.

As shown in FIGS. 22A and 22B, the cleaning mechanism 10 may include a cleaning plate 101 that contacts the surface of the cleaning roller 100. When the cleaning roller 100 cleans the bottom surface of the heat exchanger 11, dirt attached to the heat exchanger 11 may transfer to the cleaning roller 100. The cleaning plate 101 contacts the rotating cleaning roller 100, and at this time, removes dirt attached to the cleaning roller 100 from the surface of the cleaning roller. In this embodiment also, when moving the cleaned heat exchanger 11 from the retreat position to the temperature regulating position, the heat exchanger 11 is once raised and then reaches the temperature regulating position so as not to contact the cleaned heat exchanger 11 with the cleaning rotor 100. This prevents the cleaned heat exchanger 11 from being contaminated by dirt attached to the cleaning roller 100.

Figure 23A:
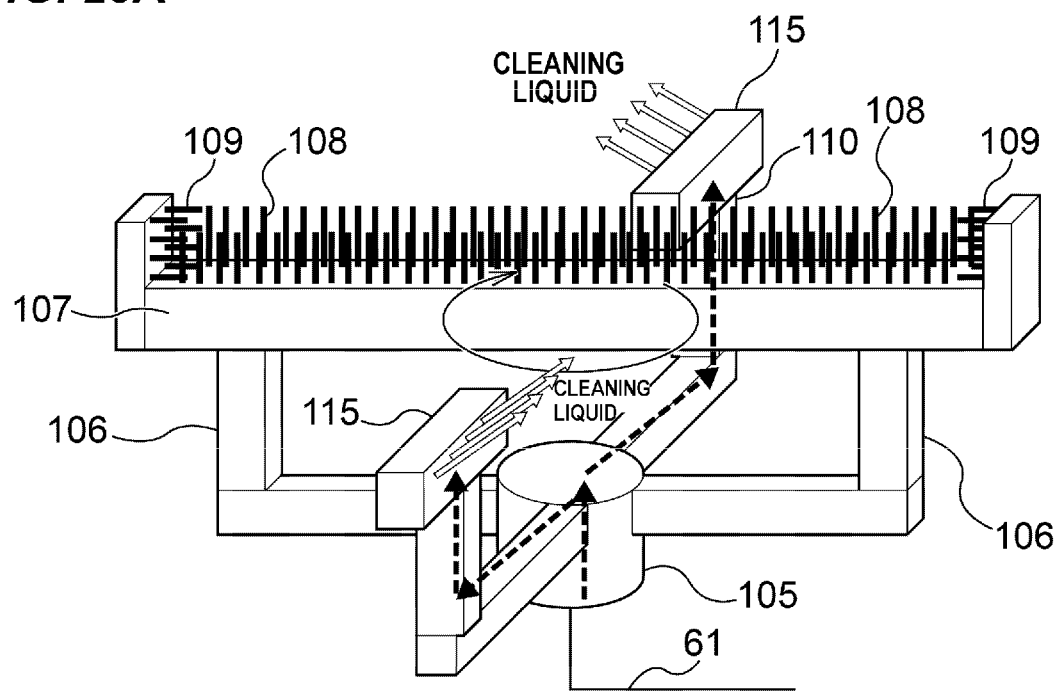
FIG. 23A is a schematic view showing an example of a cleaning brush mechanism for cleaning the bottom surface of the heat exchanger that has been moved to the retreat position.
Figure 23B:
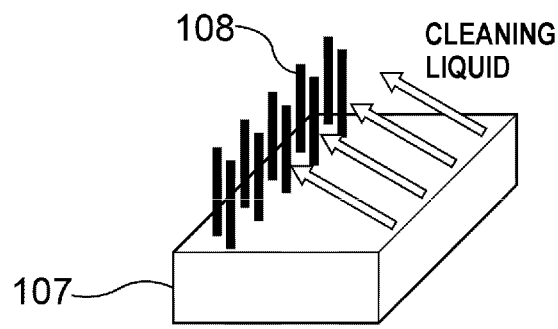
FIG. 23B is a schematic view showing a modification of a brush stand shown in FIG. 23A.

FIG. 23A is a schematic view showing an example of a cleaning brush mechanism for cleaning the bottom surface of the heat exchanger 11 that has been moved to the retreat position, and FIG. 23B is a schematic view showing a modification of a brush stand shown in FIG. 23A. Although the cleaning brush 98 and the cleaning roller 100 are provided in the middle of the path in which the heat exchanger 11 moves from the temperature regulating position to the retreat position, the cleaning brush mechanism shown in FIG. 23A cleans the bottom of the exchanger 11 that has been moved to the retreat position.

The cleaning brush mechanism shown in FIG. 23A includes a brush shaft (a rotational shaft) 105 coupled to the cleaning-liquid supply line 61, a first support 106 fixed to the brush shaft 105, a brush stand 107 attached to the first support 106, cleaning brushes 108 and 109 provided on the brush stand 107, a second supports 110 fixed to the brush shaft 105, and cleaning liquid blocks 115 which are attached to the second support 110, respectively, and in which a plurality of openings for ejecting the cleaning liquid are formed, respectively.

The cleaning brush 108 is fixed to an upper surface of the brush stand 107, and serves as a bottom-cleaning brush contacting the bottom surface of the heat exchanger 11 lying in the retreat position. The brush stand 107 has a length larger than the diameter of the heat exchanger 11, and the cleaning brush 108 is fixed to the brush stand 107 so as to be capable of contacting the entire bottom surface of the heat exchanger 11.

The cleaning brushes 109 are fixed to side surfaces of protrusions which are formed at both ends of the brush stand 107 respectively, the protrusions extending from those both ends upwardly. The cleaning brushes 109 serve as side-cleaning brushes contacting a side surface of the heat exchanger 11 lying in the retreat position. The cleaning brushes 109 are preferably fixed to the protrusions so as to be capable of contacting the entire side surface of the heat exchanger 11. Although, in the illustrated example, the cleaning brushes 109 are fixed to each of two protrusions fixed to both ends of the brush stand 107, this embodiment is not limited to this example. For example, the cleaning brush 109 may be fixed to only one protrusion.

The first support 106 has a substantially C-shape, and the brush stand 107 is fixed to both ends of the first support 106. The second support 110 also has a substantially C-shape, and the cleaning liquid blocks 115 are fixed to each end of the second support 110. The brush shaft 105, the second support 110, and the cleaning liquid block 115 have flow passages formed therein, which allow the cleaning liquid supplied from the cleaning-liquid supply line 61 to reach a plurality of openings of the cleaning liquid block 115. The brush shaft 105 is rotatably supported by a bearing (not shown).

When the cleaning liquid is supplied to the cleaning brush mechanism from the cleaning-liquid supply line 61, the cleaning liquid is jetted from the plurality of openings of the cleaning liquid blocks 115 through the flow passages formed in the brush shaft 105, the second support 110, and the cleaning liquid blocks 115. The plurality of openings of the cleaning liquid blocks 115 are configured to jet the cleaning liquid obliquely upward. Therefore, the cleaning liquid jetted from the plurality of openings of the cleaning liquid blocks 115 collides obliquely with the bottom surface of the heat exchanger 11. When the cleaning liquid is jetted from the cleaning liquid blocks 115, a reaction force for attempting to rotate the brush shaft 105 is generated. Because this reaction force causes the brush shaft 105 and the first support 106 fixed to the brush shaft 105 to be rotated, the cleaning brushes 108 and 109 can be rotated with no need of the power such as a motor. The rotating cleaning brush 108 removes dirt attached to the bottom surface of the heat exchanger 11, and further the rotating cleaning brushes 109 remove dirt attached to the side surface of the heat exchanger 11.

As shown in FIG. 23B, the brush stand 107, in which the cleaning brush 108 is disposed, may have openings for jetting the cleaning liquid, formed in the upper surface thereof. In this case, the second support 110 and the cleaning liquid block 115 may be omitted. Further, the flow passages to which the cleaning-liquid supply line 61 is coupled, is formed in the brush shaft 105, the first support 106, and the brush stand 107.

Figure 24:
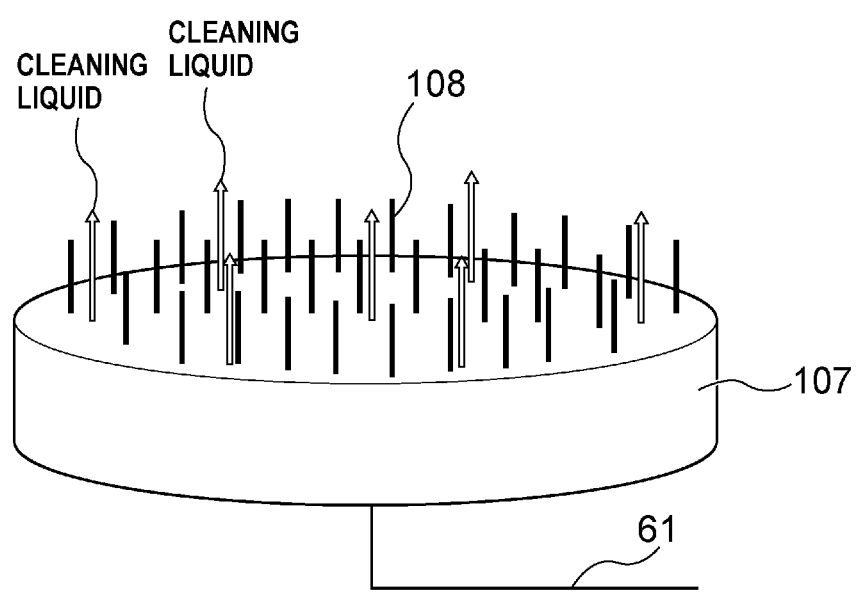
FIG. 24 is a schematic view showing an example of a cleaning pad for cleaning the bottom surface of the heat exchanger moved to the retreat position.
Figure 25:
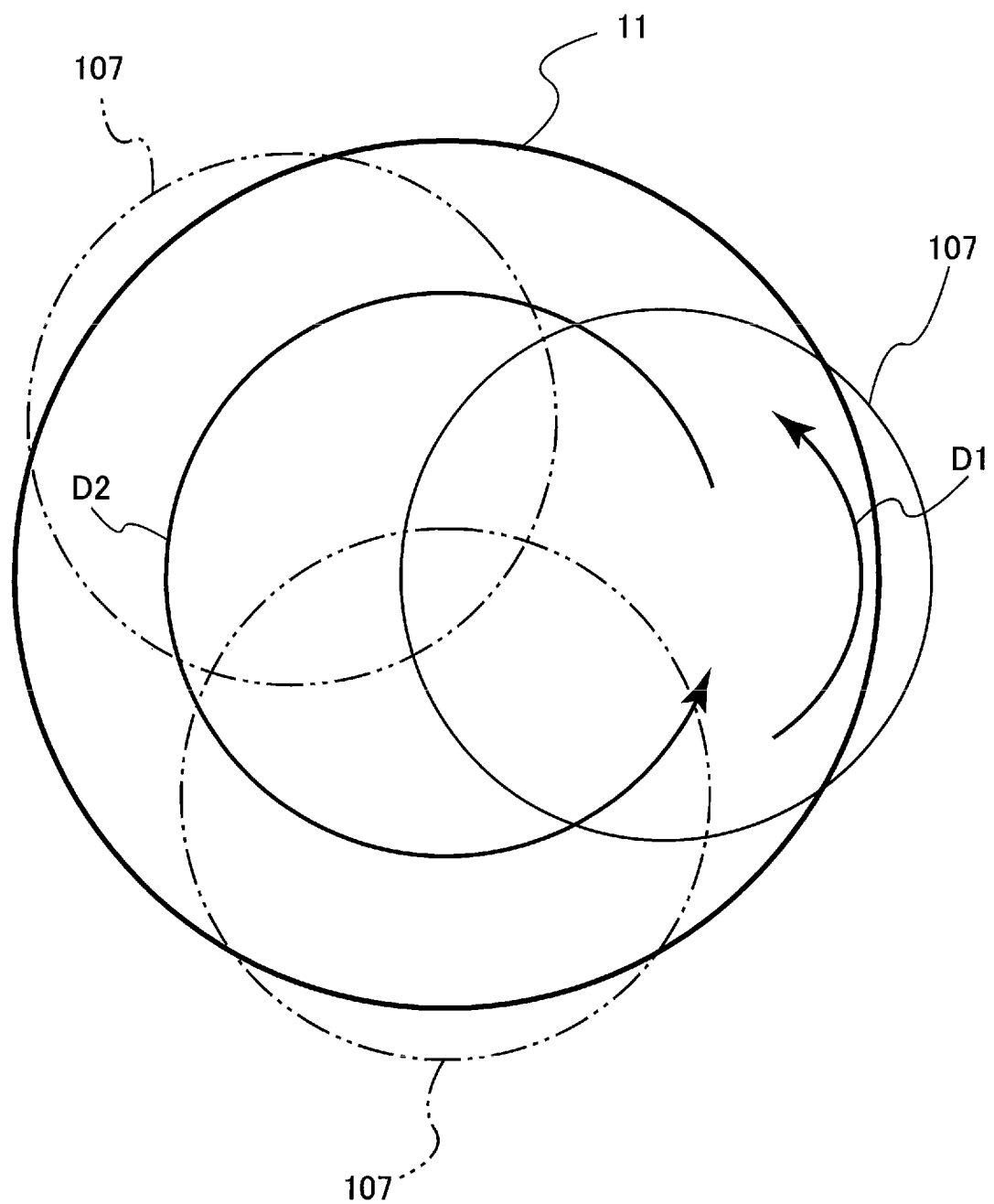
FIG. 25 is a schematic view showing a track of the cleaning pad, shown in FIG. 24, with respect to the bottom surface of the heat exchanger.

FIG. 24 is a schematic view showing an example of a cleaning pad for cleaning the bottom surface of the heat exchanger 11 moved to the retreat position, and FIG. 25 is a schematic view showing a track of the cleaning pad, shown in FIG. 24, with respect to the bottom surface of the heat exchanger 11. The cleaning pad 107 shown in FIG. 24 has a cleaning brush 108 fixed on an upper surface thereof. Further, a plurality of openings for ejecting the cleaning liquid, which is supplied to the cleaning pad 107 from the cleaning-liquid supply line 61, are formed in the upper surface of the cleaning pad 107.

The cleaning pad 107 is coupled to a rotational shaft (not shown), and rotates in a direction indicated by an arrow D1 in FIG. 25. Further, the cleaning pad 107 rotates with respect to a center of the bottom surface of the heat exchanger 11 in a direction indicated by the arrow D2 in FIG. 25. In other words, the cleaning pad 107 revolves in the direction shown by the arrow D2 with respect to the center of the heat exchanger 11 while rotating in the direction shown by the arrow D1.

The bottom surface of the heat exchanger 11 moved to the retreat position contacts the cleaning brush 108 fixed to the upper surface of the cleaning pad 107. In this state, the cleaning pad 107 is rotated around its axis while ejecting the cleaning liquid from the upper surface of the cleaning pad 107, and further revolves with respect to the bottom surface of the heat exchanger 11. This causes dirt firmly attached to the bottom surface of the heat exchanger 11 to be removed.

In one embodiment, the cleaning brush 108 may be omitted, and the cleaning pad 107 may be made of a resin such as polyvinyl alcohol (PVA). In this case, the bottom surface of the heat exchanger 11 lying in the retreat position is directly placed in contact with the upper surface of the cleaning pad 107. In this state, the cleaning pad 107 is rotated while ejecting the cleaning liquid from the upper surface of the cleaning pad 107, and further revolved with respect to the bottom surface of the heat exchanger 11, so that the upper surface of the cleaning pad 107 enables dirt attached to the bottom to be scraped off.

Figure 26:
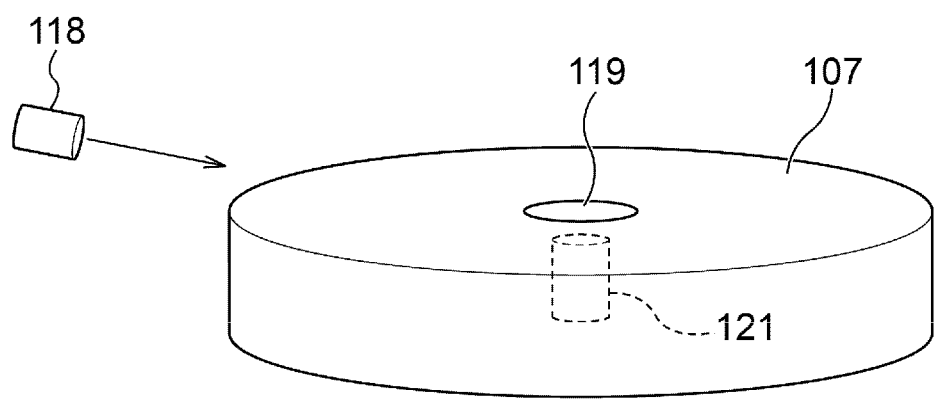
FIG. 26 is a schematic view showing a modification of the cleaning pad 107 shown in FIG. 24.

FIG. 26 is a schematic view showing a modification of the cleaning pad 107 shown in FIG. 24. In FIG. 26, the cleaning brush 108 is omitted from illustration. An imaging device 121 is built in a center of the cleaning pad 107. More specifically, the cleaning pad 107 has a recess, formed therein, extending downward from an upper surface of the cleaning pad 107, and the imaging device 121 is disposed in the recess. Further, a transparent window 119 for preventing the cleaning liquid from entering the imaging device 121 is provided in an opening of the recess formed in the cleaning pad 107.

In this embodiment, the heat exchanger 11 before starting of use thereof is moved above the cleaning pad 107, and the imaging device 121 acquires in advance an image of the bottom surface of the heat exchanger 11 before starting of use. This image of the bottom surface of the heat exchanger 11 before starting of use serves as an initial image of the bottom surface of the heat exchanger 11, and is stored in advance in the imaging device 121 or the controller (not shown) of the pad-temperature regulating apparatus 5. In one embodiment, the initial image of the bottom surface of the heat exchanger 11 may be stored in advance in a controller (not shown) of the polishing apparatus.

The bottom surface of the heat exchanger 11 contaminated by polishing of the wafer W is cleaned by the cleaning pad 107. The heat exchanger 11 after the cleaning is moved above the cleaning pad 107, and the imaging device 121 acquires an image of the bottom surface of the heat exchanger 11. The controller of the imaging device 121 or the pad-temperature regulating apparatus 5 compares the initial image with the acquired image to check whether or not dirt has been attached to the bottom surface of the heat exchanger 11. For example, the controller compares a difference in contrast between the initial image and the acquired image, and determines whether or not the difference in contrast exceeds a threshold value stored in advance in the controller. When the difference in contrast is within the threshold, the controller determines that dirt has been removed from the bottom surface of the heat exchanger 11, and moves the heat exchanger 11 to the temperature regulating position. When the difference in contrast exceeds the threshold, the controller determines that dirt is still attached to the bottom surface of the heat exchanger 11, and again cleans the bottom surface of the heat exchanger 11 by use of the cleaning pad 107.

As shown in FIG. 26, the cleaning apparatus preferably has a nozzle 118 for jetting gas toward the transparent window. Before the imaging device 121 acquires the image of the bottom surface of the heat exchanger 11, a gas (for example, compressed air or nitrogen gas) is jetted from the nozzle 118 toward the transparent window 119 to thereby blow away dirt, such as polishing liquid, attached to the transparent window 119. Therefore, the imaging device 121 can acquire an accurate image of the bottom surface of the heat exchanger 11 without being interfered by dirt such as a polishing liquid.

In one embodiment, the controller may store in advance the number of repetitions of cleaning of the bottom surface of the heat exchanger 11. If the bottom surface of the heat exchanger 11 has been cleaned until reaching the number of repetitions, the controller is configured to issue an alarm. With this configuration, the heat exchanger 11 which has reached the end of its life due to dirt can be replaced early, and thus the occurrence of scratches due to dirt can be prevented.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A cleaning apparatus for a heat exchanger to regulate a surface temperature of a polishing pad, comprising:
   a moving mechanism configured to move the heat exchanger between a temperature-regulating position in which the heat exchanger can exchange heat with the polishing pad, and a retreat position in which the heat exchanger is separated from a surface of the polishing pad; and a cleaning mechanism configured to clean a bottom surface of the heat exchanger moved to the retreat position, wherein the retreat position is located on a side of the polishing pad, and the cleaning mechanism includes at least one cleaning nozzle for ejecting a cleaning liquid to the bottom surface of the heat exchanger moved to the retreat position, or a cleaning tank in which the bottom surface of the heat exchanger can be immersed.

2. The cleaning apparatus according to claim 1,
wherein the cleaning mechanism further includes:
a cleaning-liquid supply line coupled to the cleaning tank; and
a cleaning-liquid discharge line coupled to the cleaning tank, and
the cleaning-liquid discharge line is coupled to the lowermost end of the cleaning tank.

3. The cleaning apparatus according to claim 2, wherein the cleaning-liquid supply line is mounted to a side wall of the cleaning tank such that the cleaning liquid is discharged in a tangential direction of the cleaning tank.

4. The cleaning apparatus according to claim 1,
wherein the cleaning mechanism further includes:
a cleaning-liquid supply line coupled to the cleaning tank;
an overflow tank for receiving the cleaning liquid overflowing from the cleaning tank; and
a cleaning-liquid discharge line coupled to the overflow tank.

5. The cleaning apparatus according to claim 4, wherein the cleaning mechanism includes a plate member which constitutes a bottom wall of the cleaning tank or is disposed inside of the cleaning tank, and
the plate member has a flow passage coupled to the cleaning-liquid supply line, and a plurality of holes which enables the flow passage to communicate with an inside of the cleaning tank.

6. The cleaning apparatus according to claim 1,
wherein the cleaning mechanism further includes:
a cleaning-liquid supply line coupled to the cleaning tank; and
a cleaning-liquid discharge line coupled to the cleaning tank,
the cleaning-liquid discharge line has an inlet opened inside of the cleaning tank, and
the inlet is located below an upper end of the cleaning tank.

7. The cleaning apparatus according to claim 1,
wherein the cleaning mechanism further includes:
a cleaning-liquid supply line coupled to the cleaning tank; and
a cleaning-liquid discharge line coupled to the cleaning tank,
the cleaning-liquid discharge line has an inlet coupled to the lowermost end of the cleaning tank, and an outlet opened to the atmosphere, and
the outlet is located at a position lower than an upper end of the cleaning tank and higher than a lower end of the cleaning tank.

8. The cleaning apparatus according to claim 1,
wherein the moving mechanism includes:
a pivoting mechanism configured to pivot the heat exchanger with respect to the surface of the polishing pad in a horizontal direction; and an elevating mechanism configured to move the heat exchanger upward and downward with respect to the surface of the polishing pad.

9. The cleaning apparatus according to claim 1,
wherein the moving mechanism includes:
a pivoting mechanism configured to turn the heat exchanger with respect to the surface of the polishing pad in a vertical direction while pivoting the heat exchanger with respect to the surface of the polishing pad in a horizontal direction; and
an elevating mechanism configured to move the heat exchanger upward and downward with respect to the surface of the polishing pad.

10. The cleaning apparatus according to claim 9,
wherein the pivoting mechanism includes;
a shaft coupled to the heat exchanger through an arm;
an actuator configured to rotate the shaft to pivot the arm and the heat exchanger with respect to the surface of the polishing pad;
a cam mechanism configured to convert a rotational movement of the shaft into a turning movement of the heat exchanger, and
the cam mechanism includes:
a cam fixed to the arm; and
a guide plate having a guide surface for guiding the turning movement of the heat exchanger.

11. The cleaning apparatus according to claim 1,
wherein the moving mechanism includes:
a piston-cylinder mechanism having a piston; and
a link mechanism configured to convert movement of the piston into a vertically pivoting movement of the arm to which the heat exchanger is coupled.

12. The cleaning apparatus according to claim 1, wherein the cleaning mechanism includes a cleaning member which contacts the bottom surface of the heat exchanger during moving of the heat exchanger from the temperature-regulating position to the retreat position.

13. The cleaning apparatus according to claim 12,
wherein the cleaning member is a cleaning brush, and
the cleaning brush is disposed in a cutout formed in an upper end of a cylindrical cup which surrounds the polishing pad.

14. The cleaning apparatus according to claim 12,
wherein the cleaning member is a cleaning brush, and
the cleaning mechanism further includes a cleaning plate which contacts a surface of the cleaning brush to remove dirt attached to the cleaning brush.

15. The cleaning apparatus according to claim 1,
wherein the cleaning mechanism is a cleaning brush mechanism configured to contact the bottom surface of the heat exchanger lying in the retreat position, and
the cleaning brush mechanism includes:
a cleaning brush which contacts the bottom surface of the heat exchanger;
a brush stand in which the cleaning brush is disposed;
a cleaning block having an opening configured to eject the cleaning liquid to the bottom surface of the heat exchanger; and
a rotational shaft to which the brush stand and the cleaning block are coupled, and which are rotated by utilizing a reaction force generated when the cleaning liquid is ejected from the cleaning block.

16. The cleaning apparatus according to claim 1, wherein the cleaning member is a cleaning pad having a brush which contact the bottom surface of the heat exchanger, and the cleaning pad is configured to be rotatable around its axis and revolvable with respect to the bottom surface of the heat exchanger.

17. The cleaning apparatus according to claim 16, wherein the cleaning pad includes:
 an imaging device which is disposed in a recess formed in an upper surface of the cleaning pad, and can acquire an image of the bottom surface of the heat exchanger; and
 a transparent window for closing an opening of the recess.

18. A polishing apparatus comprising:
a polishing table for supporting a polishing pad;
a polishing head configured to press a substrate against a surface of the polishing pad to polish the substrate;
a heat exchanger configured to regulate a surface temperature of the polishing pad; and
a cleaning apparatus for cleaning the heat exchanger, wherein the cleaning apparatus comprises a cleaning apparatus according to claim 1.

19. A cleaning apparatus for a heat exchange to regulate a surface temperature of a polishing pad, comprising:
 a moving mechanism configured to move the heat exchanger between a temperature-regulating position in which the heat exchanger can exchange heat with the polishing pad, and a retreat position in which the heat exchanger is separated from a surface of the polishing pad; and
 a cleaning mechanism configured to clean a bottom surface of the heat exchanger moved to the retreat position,
 wherein the retreat position is located above the polishing pad, and
 the cleaning mechanism includes a cleaning tank in which the bottom surface of the heat exchanger can be immersed.

\* \* \* \* \*